United States Patent [19]

Sudo

[11] Patent Number: 4,594,524
[45] Date of Patent: Jun. 10, 1986

[54] CORELESS-BRUSHLESS MOTOR

[75] Inventor: Michio Sudo, Kuki, Japan

[73] Assignee: Kangyo Denkikiki Kabushiki Kaisha, Tokyo, Japan

[21] Appl. No.: 582,414

[22] Filed: Feb. 22, 1984

[51] Int. Cl.⁴ .......................................... H02K 11/00
[52] U.S. Cl. ...................... 310/68 R; 310/43; 310/71; 310/184; 310/207; 310/259; 310/268; 310/DIG. 3; 310/DIG. 6; 318/254; 324/251
[58] Field of Search ............... 310/40 MM, 42, 207, 310/208, 268, 156, DIG. 3, 68 R, 68 B, DIG. 6, 68 E, 72, 45, 216, 217, 259, 266, 90, 180, 184, 43, 71; 318/254 A, 254; 324/235, 251, 252; 29/596

[56] References Cited

U.S. PATENT DOCUMENTS

| | | | |
|---|---|---|---|
| 2,607,816 | 8/1952 | Ryder | 310/42 |
| 2,709,762 | 5/1955 | Naul | 310/259 |
| 3,414,746 | 12/1968 | Melvin | 310/52 |
| 3,999,108 | 12/1976 | Tanikoshi | 318/254 A |
| 4,072,881 | 2/1978 | Ban | 310/268 |
| 4,135,120 | 1/1979 | Hoshimi | 318/254 A |
| 4,167,692 | 9/1979 | Sekiya | 310/268 |
| 4,174,484 | 11/1979 | Schmider | 310/268 |
| 4,336,475 | 6/1982 | Morinaga | 310/45 |
| 4,340,833 | 7/1982 | Sudo | 310/268 |
| 4,394,594 | 7/1983 | Schmider | 310/68 R |
| 4,395,815 | 8/1983 | Stanley | 310/216 |
| 4,429,240 | 1/1984 | Kishi | 310/DIG. 6 |
| 4,455,516 | 6/1984 | Furusho | 310/268 |

FOREIGN PATENT DOCUMENTS

| | | | |
|---|---|---|---|
| 0030008 | 11/1980 | European Pat. Off. | 310/DIG. 6 UX |
| 1020720 | 12/1957 | Fed. Rep. of Germany | 310/217 |
| 0100057 | 7/1980 | Japan | 310/68 R |
| 0009563 | 1/1983 | Japan | 310/DIG. 6 |
| 0003558 | 1/1983 | Japan | 310/268 |
| 0004351 | 1/1983 | Japan | 310/DIG. 6 |

Primary Examiner—R. Skudy
Attorney, Agent, or Firm—Pollock, Vande Sande and Priddy

[57] ABSTRACT

In a coreless-brushless motor in which a driving coil block is mounted on a stator yoke, a bearing is fixed to the stator yoke in alignment with the central portion of the driving coil block, a rotary shaft is rotatably supported by the bearing, a rotor yoke is affixed to the rotary shaft and a rotor magnet is mounted on the rotor yoke in adjacent and opposing relation to the driving coil block, a magnetoelectric transducer pellet is housed in a recess made in the stator yoke on the side of the driving coil block, for detecting magnetic fluxes emanating from the rotor magnet. The magnetoelectric transducer pellet is connected to wires of a flexible printed circuit sheet, which is disposed between the stator yoke and the driving coil block.

25 Claims, 36 Drawing Figures

CORELESS-BRUSHLESS MOTOR

BACKGROUND OF THE INVENTION

The present invention relates to an axial flux type coreless-brushless motor in which a stator yoke, a driving coil block, a rotor magnet and a rotor yoke are sequentially stacked up.

In this kind of coreless-brushless motor, the driving coil block is formed by laminating a plurality of sheet coils with an insulating layer interposed between adjacent ones of them as disclosed, for example, in U.S. Pat. No. 4,340,833 and EPC Publication No. 30,008 (June 10, 1981). The sheet coils each have a plurality of spiral coils formed as conductor patterns at equiangular intervals on at least one side of an insulating sheet. For interconnecting the sheet coils of the driving coil block, it is the general practice in the prior art to lead out two leads from each sheet coil and to solder such leads of the respective sheet coils for interconnection. The leads are soldered outside the laminated sheet coils, but the space that is occupied by the soldered connecting blocks in the motor increases with an increase in the number of sheet coils used. In other words, the space in the motor is unnecessarily consumed by the connecting portions which do not directly serve to produce the motor driving force.

In the coreless-brushless motor, the rotational angular position of a rotor magnet is detected and, by the detected output, each phase current of a multi-phase driving coil is controlled to be turned ON and OFF. A Hall element has been employed for detecting the rotational angular position of the rotor magnet. An ordinary Hall element is produced by connecting leads to a Hall element pellet and then molding it with resin, and even a miniaturized element is about 2 mm thick. Since such a Hall element is disposed between the stator yoke and the rotor magnet, there is a limit to the reduction of the magnetic air gap between the rotor magnet and the stator yoke, imposing limitations on the reduction of the thickness of the motor and resulting in lowered efficiency.

Driving devices for a floppy disc, a VTR and so forth must be controlled in speed with a relatively high degree of accuracy. One method that has been employed to meet this requirement is to provide a frequency generating coil (hereinafter referred to as the FG coil) between the stator yoke and the rotor magnet to obtain an AC signal of a relatively high frequency proportional to the revolving speed of the rotor magnet. With this method, even if the rotating speed of the rotor magnet is low, an AC signal of relatively high frequency is obtained, by which the speed control can be effected with high accuracy, and the motor can be made smaller than in a case where the FG coil is disposed outside the motor case. However, since the FG coil responds to magnetic fluxes from the rotor magnet to generate an AC signal and also responds to magnetic fluxes from the driving coil, the output of the FG coil contains components of a low frequency AC signal caused by the magnetic flux of the driving coil and a high frequency AC signal caused by the magnetic flux of the rotor magnet superimposed on each other. As a result of this, in a case of detecting the frequency, that is, the revolving speed of the rotor magnet, as the frequency of zero level crossing pulses of the output AC signal from the FG coil, some of the AC signals based on the magnetic flux of the rotor magnet do not cross the zero level owing to the abovesaid superimposition, making correct speed detection impossible.

SUMMARY OF THE INVENTION

It is therefore an object of the present invention to provide a coreless-brushless motor which can be miniaturized.

Another object of the invention is to provide a coreless-brushless motor in which the air gap between the rotor magnet and the stator yoke can be reduced to achieve high efficiency.

Yet another object of the present invention is to provide a coreless-brushless motor which permits the detection of its revolving speed with high accuracy.

According to the present invention, in a coreless-brushless motor which comprises a stator yoke, a driving coil block mounted thereon, a stator, a rotary shaft rotatably supported by a bearing fixed to the stator coaxially with the driving coil block, a rotor yoke affixed to the rotary shaft and a rotor magnet attached to the rotor yoke in adjacent and opposing relation to the driving coil block, a magnetoelectrical transducer pellet for detecting the magnetic field of the rotor magnet is housed in a recess made in the stator yoke on the side of the driving coil block, and is connected to a circuit of a flexible printed circuit sheet which is interposed between the stator yoke and the driving coil block.

The driving coil block is an assembly of a plurality of sheet coils laminated with a 30μ or less insulating layer formed between adjacent ones of them. The sheet coils each have a plurality of spiral coils formed, on at least one side of a 30μ or less thick insulating sheet, as 10 to 200μ thick conductor patterns at equiangular intervals about the rotary shaft. A plurality of interconnect sections are provided in the driving coil block and, in these sections, interconnect conductor layers are formed as conductor patterns on the insulating sheet of the respective sheet coils; a through holes is made in each interconnect section to extend through the interconnect conductor layers and the insulating sheets superimposed on one another; an interconnect conductor is pressed into the through hole; and the peripheral surface of the interconnect conductor is connected by solder to those positions of the interconnect conductor layers exposed onto the inner peripheral surface of the through hole. In each interconnect section, the coils of the plurality of sheet coils are connected through the conductor patterns, interconnecting the plurality of sheet coils through the interconnect section. Alternatively, a printed circuit sheet is laminated together with the sheet coils of the driving coil block; the printed circuit sheet has required wires formed as conductor patterns on an insulating sheet 30μ or less in thickness; interconnect conductor layers corresponding to at least two interconnect sections are formed on the printed circuit sheet; the interconnect conductor of each interconnect section is extended and pressed into a hole bored through either of these interconnect conductor layers and the insulating sheet and connected thereto; and the interconnect conductors are interconnected through the wire of the printed circuit sheet. Further, the coils of one of the sheet coils are connected to one of the two interconnect sections through conductor patterns, and the coils of the other sheet coil are connected to the other interconnect section through conductor patterns, by which the coils of both sheet coils are interconnected through the two interconnect sections and the wires of the printed circuit sheet. Alternatively, a terminal sheet having terminals formed on an insulating sheet is laminated together with the sheet coils of the driving coil block, and the coils of the sheet coils are connected through the interconnect sections to the terminals on the terminal sheet in the same manner as described above.

Moreover, a frequency generating coil (FG coil) is disposed between the rotor magnet and the stator yoke. The FG coil is so arranged as to induce therein, by magnetic fluxes from the revolving rotor magnet, an AC signal of a frequency proportional to the revolving speed of the rotor magnet. A portion of a drive current to the driving coil block is branched and, by the branched drive current, current induced in the FG coil by magnetic fluxes of the driving coil block is cancelled in a canceller circuit, from which is derived only the AC signal induced by the magnetic flux of the rotor magnet, thereby detecting its revolving speed.

DESCRIPTION OF THE PREFERRED EMBODIMENTS

To facilitate a better understanding of the present invention, a description will be given of this kind of motor heretofore employed.

Figure 1:
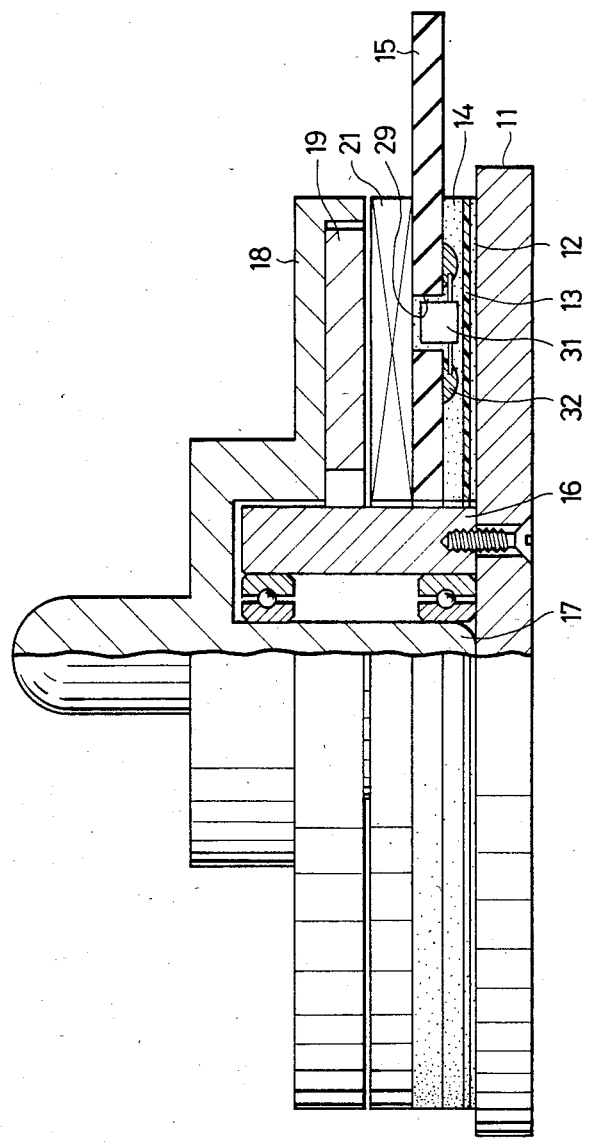
FIG. 1 is a front view showing, partly in section, a coreless-brushless motor.
Figure 2:
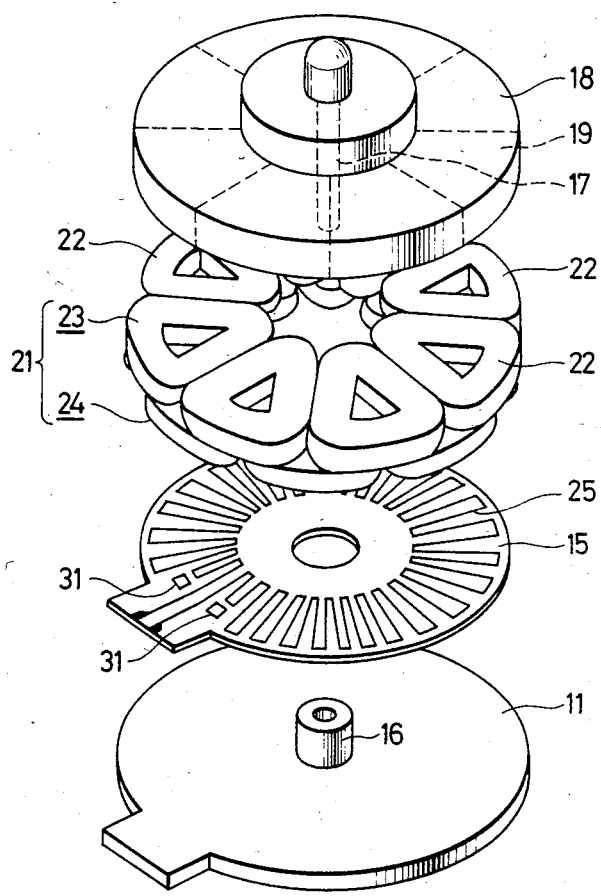
FIG. 2 is an exploded perspective view of the motor shown in FIG. 1.

In the prior art motor of this kind, for example, as shown in FIGS. 1 and 2, an insulating sheet 13 is fixedly mounted on one side of a stator yoke 11 by means of an adhesive binder 12, and a printed circuit board 15 is fixed to the insulating sheet 13 through an adhesive binder 14. The stator yoke 11 has a centrally disposed bearing 16 which projects out of the printed circuit board 15. A rotary shaft 17 is rotatably inserted into and supported by the bearing 16. A rotor yoke 18 is affixed to the rotary shaft 17, and a rotor magnet 19 is mounted on the rotor yoke 18 on the side of the printed circuit board 15. A driving coil block 21 is mounted on the printed circuit board 15 in adjacent and opposing relation to the rotor magnet 19. This example shows an eight-pole, two-phase motor, in which the driving coil block 21 comprises a first-phase coil 23 which is formed by eight coils 22 disposed at equiangular intervals about the rotary shaft 17 and a second-phase coil 24 similarly formed by eight coils that are respectively displaced from the first-phase coils 22 by an angle corresponding to one-half of the pitch of arrangement of the coils. Each coil is formed by laminating a plurality of sheet-like coils so that magnetic fluxes induced by current flowing therein may be added together. The rotor magnet 19 has eight N and S magnetic poles magnetized in its axial direction and disposed at euqiangular intervals about the rotary shaft 17.

For switching the supply to the first- and second-phase coils 23 and 24, an element is provided for detecting the rotational angular position of the rotor magnet 19. A Hall element is usually employed as this detecting element. With a view to reducing the length of the motor in its axial direction and to decreasing its thickness, a hole 29 is made in the printed circuit board 15, and a Hall element 31 is housed in the hole 29, whose leads are soldered to wires of the printed circuit board 15 as indicated by 32, forming thereon required circuits. Incidentally, an FG coil 25 may sometimes be provided on the printed circuit board 15 for detecting the revolving speed of the rotor magnet 19.

The Hall element 31 is formed by attaching leads to a Hall element pellet and then molding it with resin, and it is at least about 2 mm thick. Accordingly, the magnetic air gap between the rotor magnet 19 and the stator yoke 11 cannot be decreased smaller than the thickness of the coil block plus the thickness of the Hall element 31, imposing limitations on the reduction of the thickness of the motor and impairing its efficiency. By reducing the magnetic air gap between the rotor magnet 19 and the stator yoke 11, magnetic fluxes in the gap can be increased, or the thickness of the rotor magnet 19 can be decreased. Generally, the motor efficiency rises with an increase in the magnetic flux density in the abovesaid magnetic gap.

Figure 3:
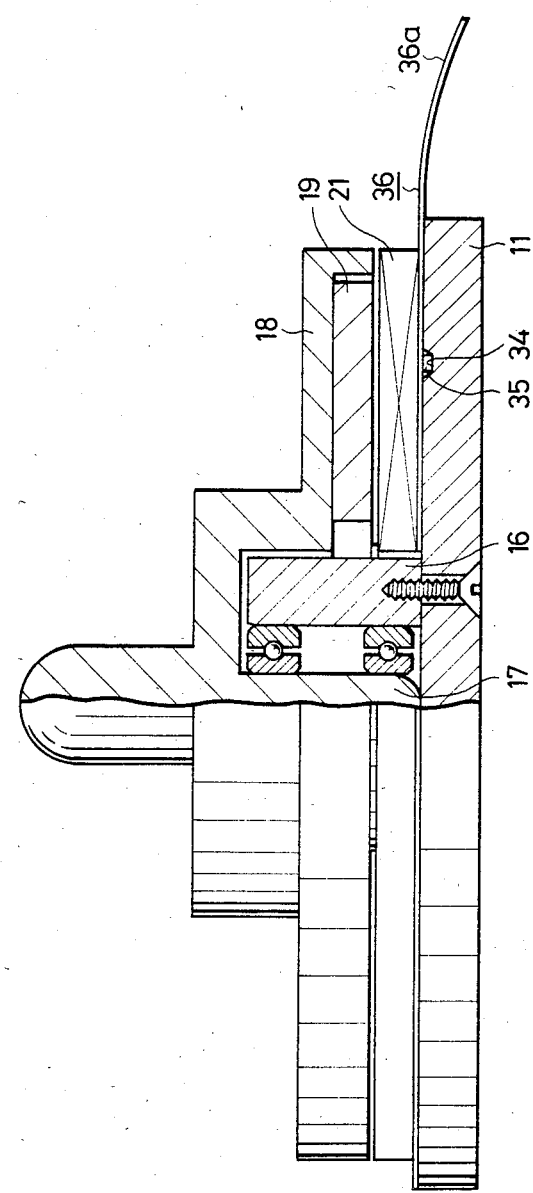
FIG. 3 is a front view illustrating, partly in section, an embodiment of the coreless-brushless motor of the present invention.
Figure 4:
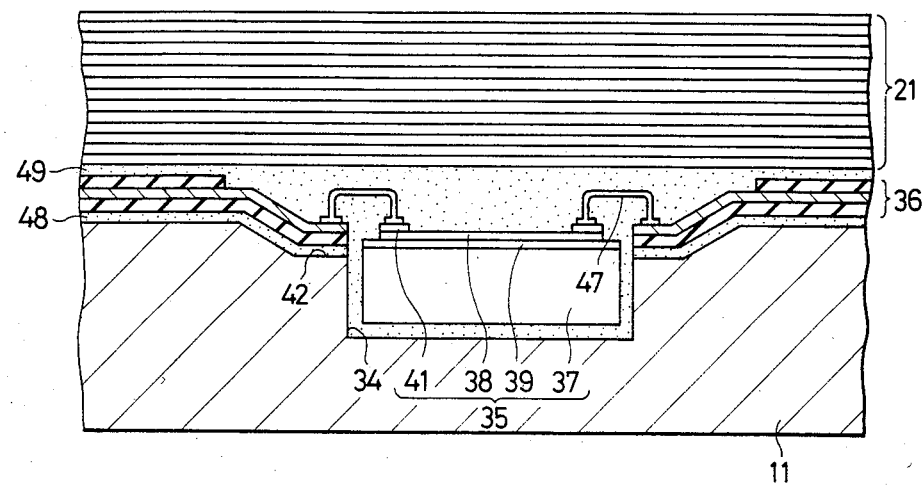
FIG. 4 is an enlarged sectional view showing the principal part of the motor shown in FIG. 3.

FIG. 3 illustrates an example of the brushless motor of the present invention, and FIG. 4 shows, on an enlarged scale, its principal part, the parts corresponding to those in FIG. 1 being identified by the same reference numerals. According to the present invention, a recess 34 is formed in the stator yoke 11 for holding a non-molded pellet 35 of a magnetoelectrical transducer element, for instance, a Hall element. The Hall element pellet 35 is connected to a circuit of a flexible printed circuit sheet 36, which is interposed between the stator yoke 11 and the driving coil block 21 and offered thereto by means of adhesive binder as indicated by 48 and 49.

The Hall element pellet 35 is fabricated by uniting a semiconductor thin wafer 38 onto a substrate 37 of ferrite, silicon, alumina or the like with an adhesive layer 39, or vapor-depositing semiconductor thin film 38 directly on the substrate 37, forming a Hall element pattern in the semiconductor thin film 38 through photoetching or like technique and forming electrodes 41 on the thin film 38, as shown in FIG. 4. It is desirable that the substrate 37 be made of soft ferrite. The Hall element pellet 35 is, for example, 0.2 to 0.5 mm thick and has a square configuration each side of which is 0.5 to 1 mm long.

It is preferable that the recess 34 in the stator yoke 11 have substantially the same size as the Hall element pellet 35 and a depth 0.1 to 0.2 mm larger than the thickness of the Hall element pellet 35 and be surrounded by a shallow depression 42, for wire bonding, the width L of which is 0.2 to 0.4 mm and the depth H of which is 0.05 to 0.2 mm.

Figure 5A:
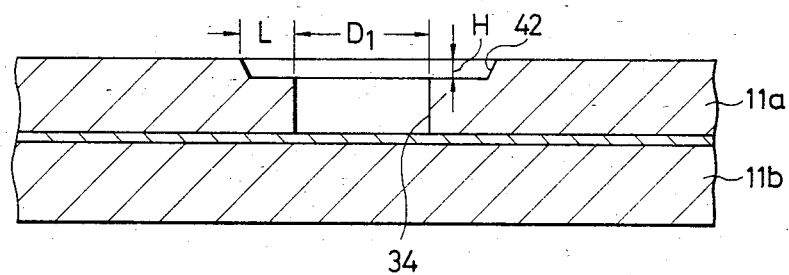
FIGS. 5A and 5B are sectional views showing a portion of a stator yoke and an example of a recess 34 made therein.
Figure 5B:
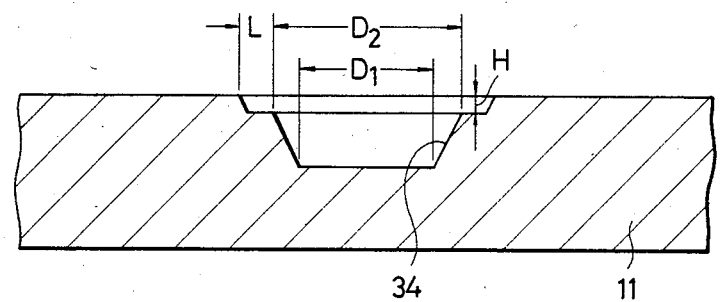

In a case of using silicon steel for the stator yoke 11, two 0.5 mm thick steel plates 11a and 11b are laminated together, a hole is made in the plate 11a to form the recess 34, and the depression 42 is formed in the plate 11a to encompass the recess 34 as shown in FIG. 5A. The length $D_1$ of one side of the recess 34 is selected large just enough to house therein the Hall element pellet 35, and the width L of the depression 42 is selected in the range of 0.2 to 0.4 mm. In a case of using soft ferrite for the stator yoke 11, the recess 34 is formed by etching, with the length $D_2$ of one side of its upper opening being $D_1+0.2$ to $D_1+0.4$ mm, where $D_1$ is the length of one side of the bottom, as shown in FIG. 5B.

Figure 6A:
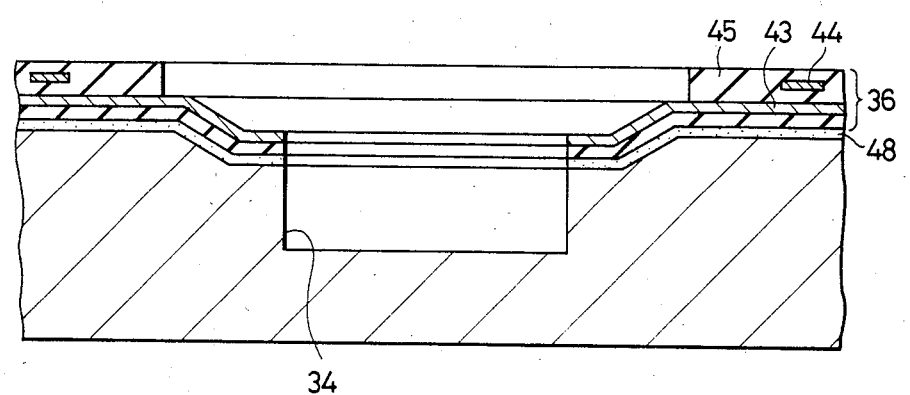
FIGS. 6A and 6B are sectional views showing, by way of example, steps for mounting a flexible printed circuit sheet 36 and a Hall element pellet 35 on the stator yoke.
Figure 6B:
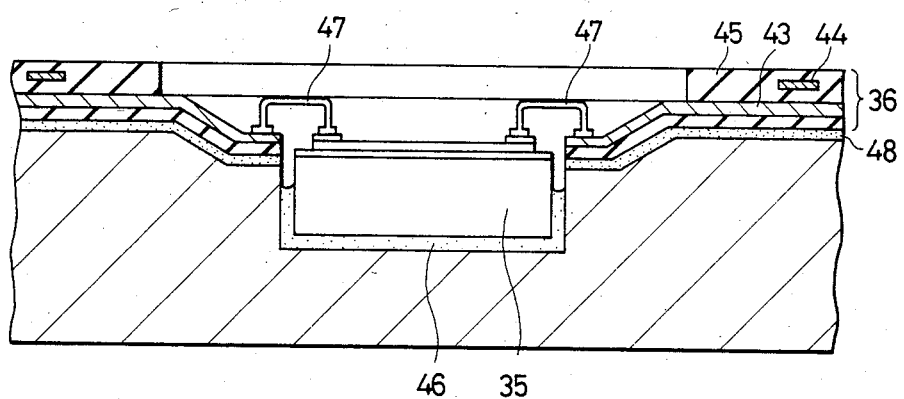

The flexible printed circuit sheet 36 is cemented by an adhesive 48 to the stator yoke 11 having made therein the recess 34, as illustrated in FIG. 6A. In this example, the printed circuit sheet 36 has formed therein, in layers, not only wires 43 for the Hall element pellet 35 but also other wiring patterns 44 such as an FG coil for detecting the revolving frequency of the rotor magnet 19, the wires 43 and the patterns 44 being buried in a flexible insulating layer 45. Around the recess 34 the insulating layer 45 is partly removed on the opposite side from the stator yoke 11, exposing the wires 43. Instead of bonding the printed circuit sheet 36 directly to the stator yoke 11, an insulating sheet may also be interposed therebetween; namely, the printed circuit sheet 36 may be joined to the stator yoke 11 by a sheet having adhesive surfaces on both faces, i.e., a two-sided adhesive sheet. Then the Hall element pellet 35 is placed in the recess 34 and bonded to the stator yoke 11 as indicated by 46 in FIG. 6B. Also in this case, an insulating sheet may be interposed between them. The electrodes of the Hall element pellet 35 and those of the wires 43 of the printed circuit sheet 36 corresponding to them are interconnected by bonding wires 47 through wire bonding. This wire bonding takes place at the depression 42. Following this, the driving coil block 21 is bonded to the printed circuit sheet 36 through an adhesive binder layer 49 as depicted in FIG. 4. In this case, an insulating sheet may also be interposed between them, that is, they may be joined together by a two-sided adhesive sheet. The adhesive binder layers 48 and 49 are formed of epoxy resin, phenol resin, silicon resin or polyimide resin, which is an electrical insulator, and each adhesive binder layer is formed to a thickness of 30$\mu$ or less including the thickness of the insulating layer. In the above arrangement, the Hall element pellet 35 may also be wire-bonded to the printed circuit sheet 36, before joining the latter to the stator yoke 11, and bonded to the stator yoke 11 after joining the driving coil block 21 to the printed circuit sheet 36.

To wiring terminals of a terminal section 36a (FIG. 3) of the printed circuit sheet 36, led out from between the stator yoke 11 and the driving coil block 21, are connected those coil terminals of the driving coil block 21 which correspond to the wiring terminals.

Figure 7A:
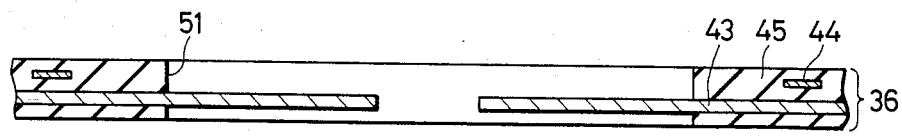
FIGS. 7A to 7E are sectional views showing another example of the step of mounting the flexible printed circuit sheet 36 and a driving coil block 21 on the stator yoke.
Figure 7B:
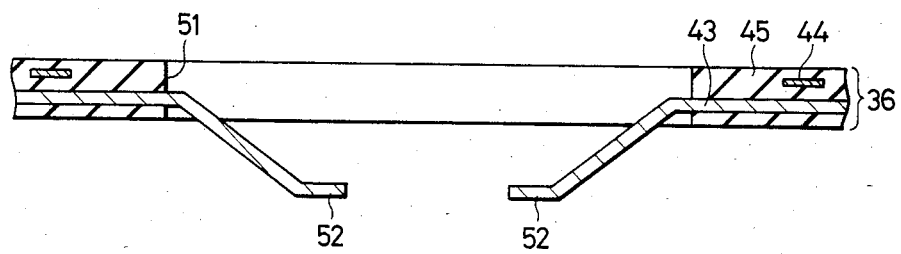
Figure 7C:
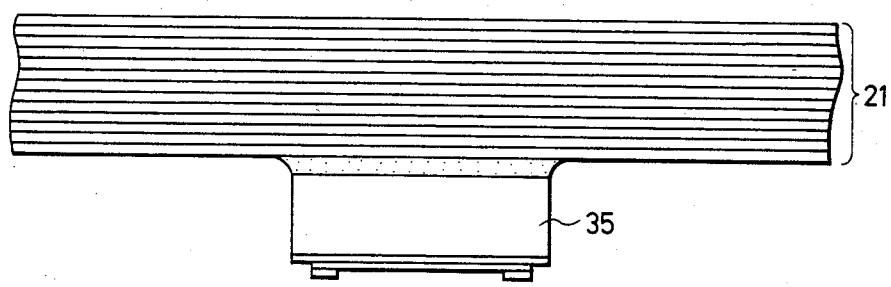
Figure 7D:
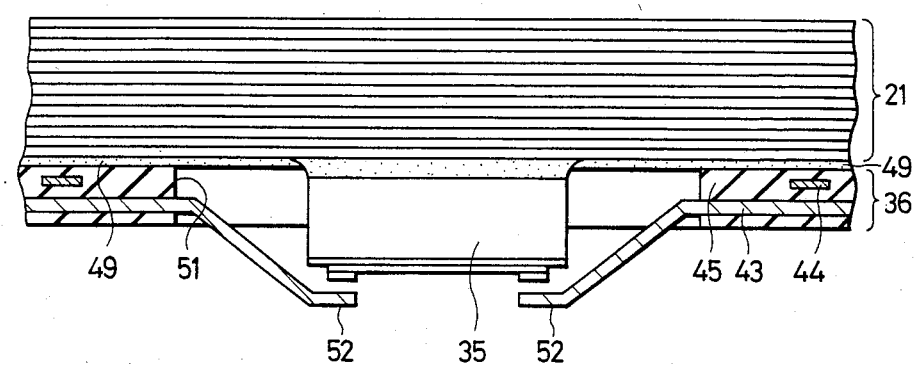
Figure 7E:
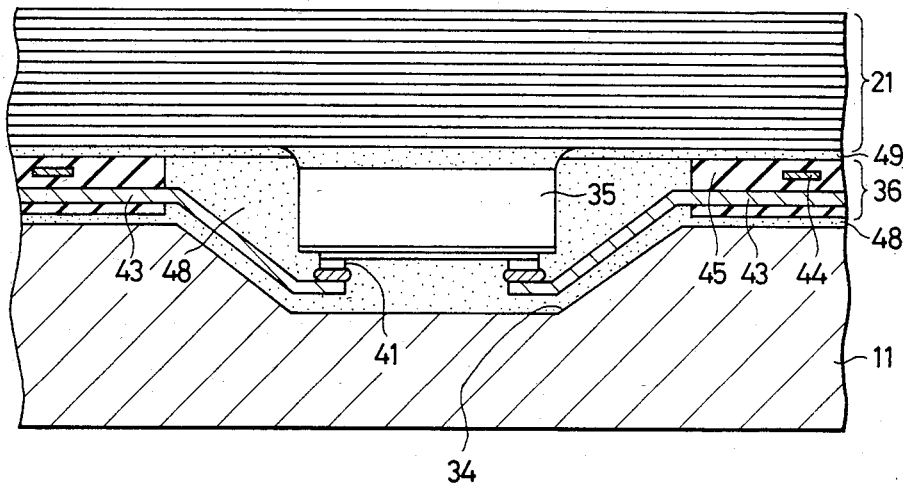

Alternatively, a hole 51 is made in the flexible printed circuit sheet 36 at the position where the Hall element pellet 35 is to be housed, as shown in FIG. 7A, and the pellet connecting wires 43 projecting into the hole 51 are each bent aslant as shown in FIG. 7B, the free end portions of the wires 43 being used as contact portions 52 parallel to the flexible printed circuit sheet 36. On the other hand, the Hall element pellet 35 is bonded to the driving coil block 21 at a predetermined position on the side of the stator yoke 11 as illustrated in FIG. 7C. Then, the flexible printed circuit sheet 36 is bonded, with the adhesive binder 49, to the driving coil block 21 on the side on which the Hall element 35 is mounted, as shown in FIG. 7D. At this time, the Hall element pellet 35 is positioned in the hole 51 of the flexible printed circuit sheet 36, the contact portions 52 of the wires 43 are soldered to the electrodes 41 (FIG. 7E) of the Hall element pellet 35 and the coil terminals of the driving coil block 21 are connected to the corresponding terminals of the terminal section 36a of the flexible printed circuit sheet 36. Next, the Hall element pellet 35 is disposed in the recess 34 and then the flexible printed circuit sheet 36 is bonded to the stator yoke 11 through the adhesive binder 48, as shown in FIG. 7E. In this case, as depicted in FIG. 7E, the inner wall of the recess 34 is tapered so that the wires 43 (FIG. 7B) projecting out obliquely of the printed circuit sheet 36 may extend along the inner wall surface of the recess 34, and the depression 42 in FIG. 4 is omitted.

Figure 8A:
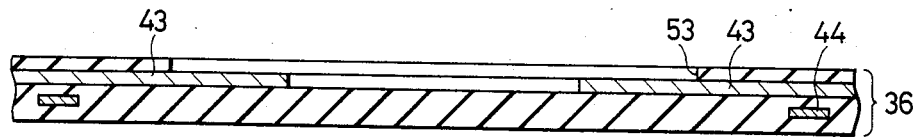
FIGS. 8A to 8D are sectional views illustrating still another example of the step of mounting the flexible printed circuit sheet 36 and the driving coil block 21 on the stator yoke.
Figure 8B:
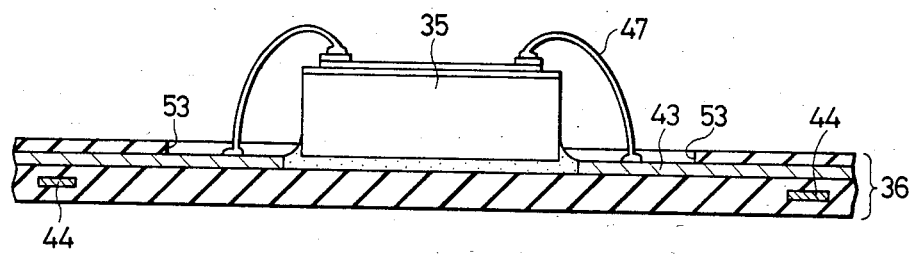
Figure 8C:
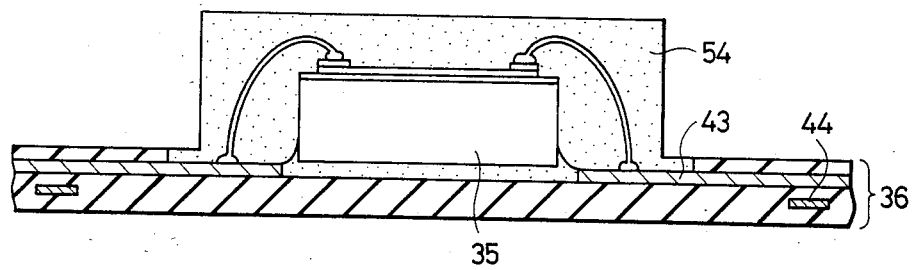
Figure 8D:
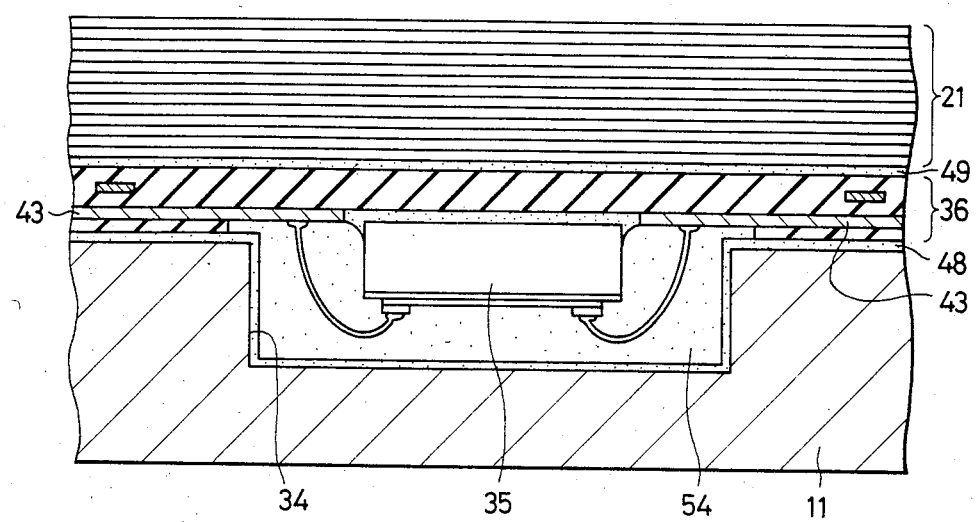

As illustrated in FIG. 8A, a recess 53 is formed in the flexible printed circuit sheet 36 at the position where the Hall element pellet 35 is to be mounted, and end portions of the wires 43 are projected out into the recess 53 to extend along the bottom thereof. The Hall element 35 is bonded to the printed circuit sheet 36 in the recess 53 and the electrodes of the Hall element pellet 35 are connected to the wires 43 via the bonding wires 47 as shown in FIG. 8B. This is followed by molding of a resinous material 54 to cover the Hall element pellet 35 and to fill up the recess 53, as shown in FIG. 8C. The flexible printed circuit sheet 36 is bonded to the driving coil block 21 and is connected to the coil terminals, after which the sheet 36 is bonded, with the adhesive binder 48, to the stator yoke 11 with the Hall element pellet 35 disposed in the recess 34, as depicted in FIG. 8D.

Figure 8E:
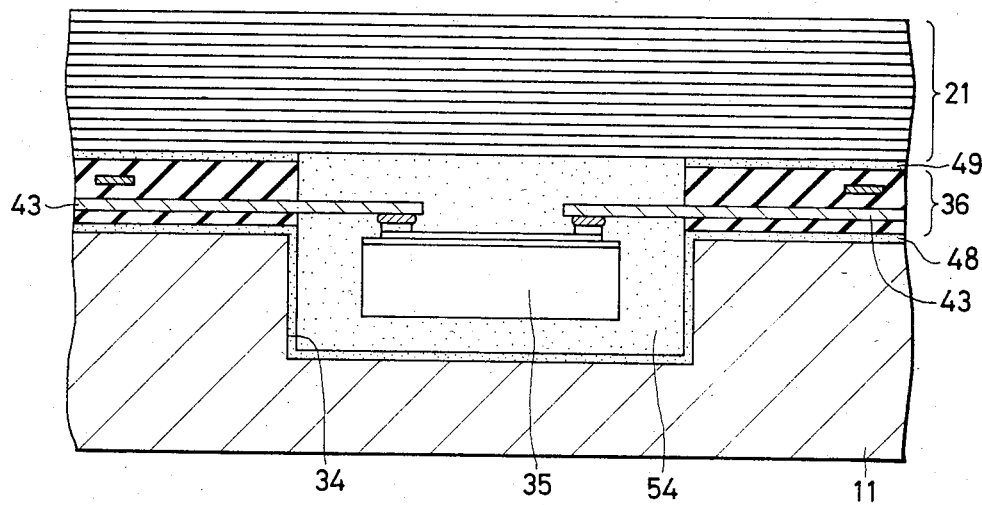
FIG. 8E is a sectional view showing another example of the step of mounting the Hall element pellet 35 on the stator yoke.

Various other methods can be employed for mounting the Hall element pellet 35 on the flexible printed circuit sheet 36. For instance, starting with the arrangement shown in FIG. 7A, the Hall element pellet 35 is disposed so that exposed conductor layer terminals of the printed circuit sheet 36 may extend onto the terminal section of the pellet 35 and the respective terminals are directly bonded or soldered to each other. Then the driving coil block 21 is laminated on and bonded to the printed circuit sheet 36, then the Hall element pellet 35 is molded, and then the laminated assembly is joined to the stator yoke 11 with the molded Hall element pellet 35 disposed in the recess 34, providing a structure such as is shown in FIG. 8E.

Figure 9:
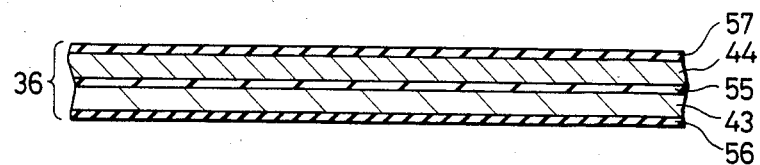
FIG. 9 is a section view illustrating a portion of an example of the flexible printed circuit sheet 36.
Figure 10A:
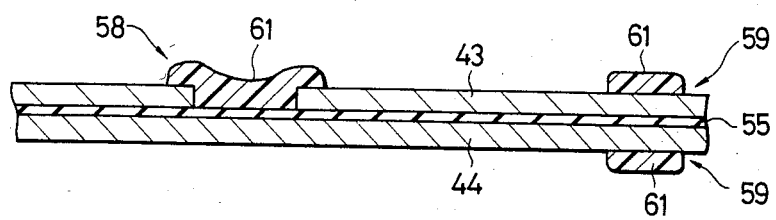
FIGS. 10A to 10D are sectional views illustrating, by way of example, steps involved in the formation of a flexible printed circuit sheet for exposing wires and in exposing the wires.
Figure 10B:
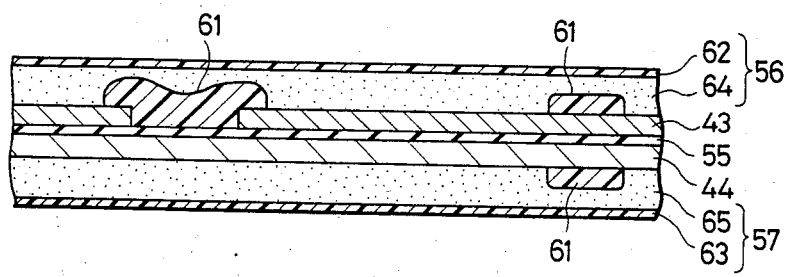
Figure 10C:
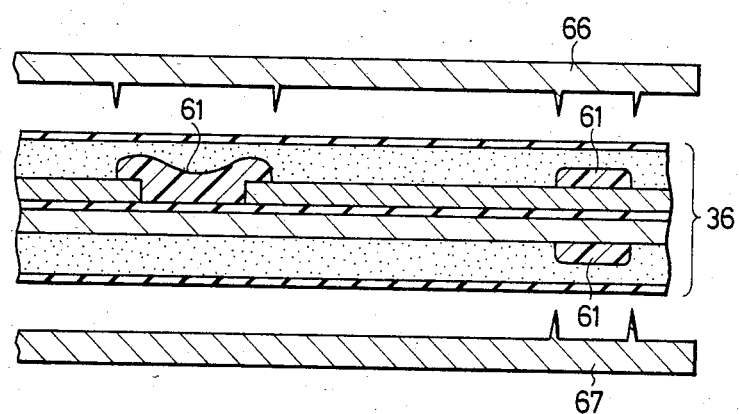
Figure 10D:
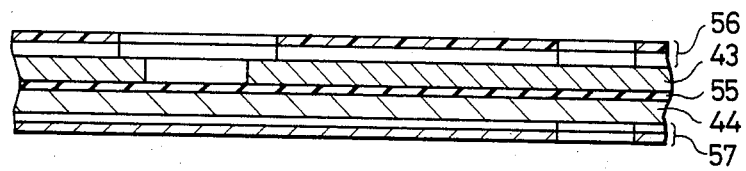

The flexible printed circuit sheet 36 is constructed, for example, as shown in FIG. 9 in which patterns of the wires for the Hall element and other wires 43 are formed by selectively etching away a 10 to 200μ (for instance, 40μ) thick copper foil deposited on one side of an intermediate insulating layer 55 of 30μ or less thick (for example, 20μ), and patterns of the FG coil and other wires 44 are similarly formed by selectively etching away a 10 to 200μ (for instance, 40μ) thick copper foil deposited on the other side of the intermediate insulating layer 55. The wires 43 and 44 are respectively covered, on the outside thereof, with 30μ or less (for instance, 20μ) thick insulating layers as cover coats 56 and 57. For exposing the wires 43 and 44, it is preferable to take such steps as follows:

As shown in FIG. 10A, after forming the wires 43 and 44 on the intermediate insulating layer 55, water-soluble layers 61 as of polyvinyl alcohol are coated over the wires 43 and 44 at the position where it is desired to connect the Hall element pellet 35 to the wire 43 and at the position where it is desired to form the terminals of the wires 43 and 44. Then, as shown in FIG. 10B, resin films 62 and 63 as of polyimide, polyester or like resin are affixed to the wires 43 and 44 with joining materials 64 and 65, forming the cover coats 56 and 57. To expose the wires 43 and 44, cutters 66 and 67 are pressed against both sides of the flexible printed circuit sheet 36 to cut therein grooves which extend down to the peripheral portion of the water-soluble layers 61. Next, the flexible printed circuit sheet 36 is rinsed with water to remove the water-soluble layers 61, exposing the desired portions of the wires 43 and 44 as shown in FIG. 10D.

Figure 11:
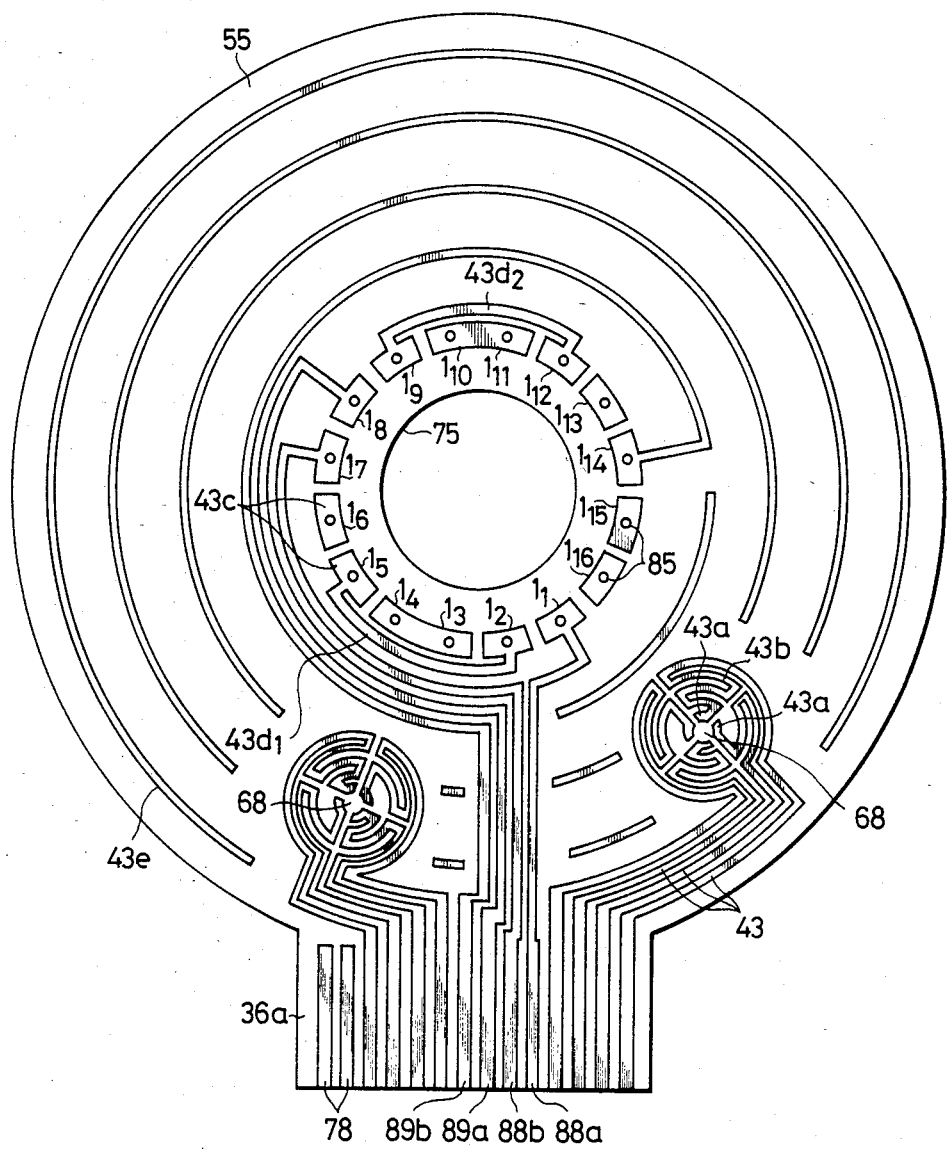
FIG. 11 is a diagram showing an example of patterns of wires 43 on the flexible printed circuit sheet.

FIG. 11 illustrates, by way of example, the patterns of the wires 43. The patterns illustrated are those for connecting the Hall element, interconnecting the sheet coils and leading out their terminals. In two small regions 68 surrounded by contact portions 43a of the wires 43 are disposed Hall element pellets of substantially the same size as the regions 68, and four electrodes of each Hall element pellet are respectively connected to the four contact portions 43a disposed around each region 68. The wires 43 near the contact portions 43a are formed as zigzag patterns 43b to absorb stresses resulting from the expansion and contraction of the wires 43 which are caused by temperature changes after fabrication, thereby preventing the disconnection of the pellets from the contact portions 43a (for example, the bonding wires). The printed circuit sheet 36 has a centrally disposed circular hole 75 for receiving therethrough the bearing 16 (FIG. 3). Interconnect conductor layers or lands 43c are arranged in a ring-like form around the circular hole 75 and, as described later, the electrode-shaped patterns 43c are used for interconnecting a plurality of sheet coils and for connecting the sheet coils to terminals. On the outside of the arrangement of interconnect conductor layers or lands 43c are formed circular arc-shaped connection wires 43d for interconnecting the layers or lands 43c, through which wires and the sheet coils are interconnected. Outside the connection wires 43d reinforcing patterns 43e are formed concentrically therewith.

Figure 12:
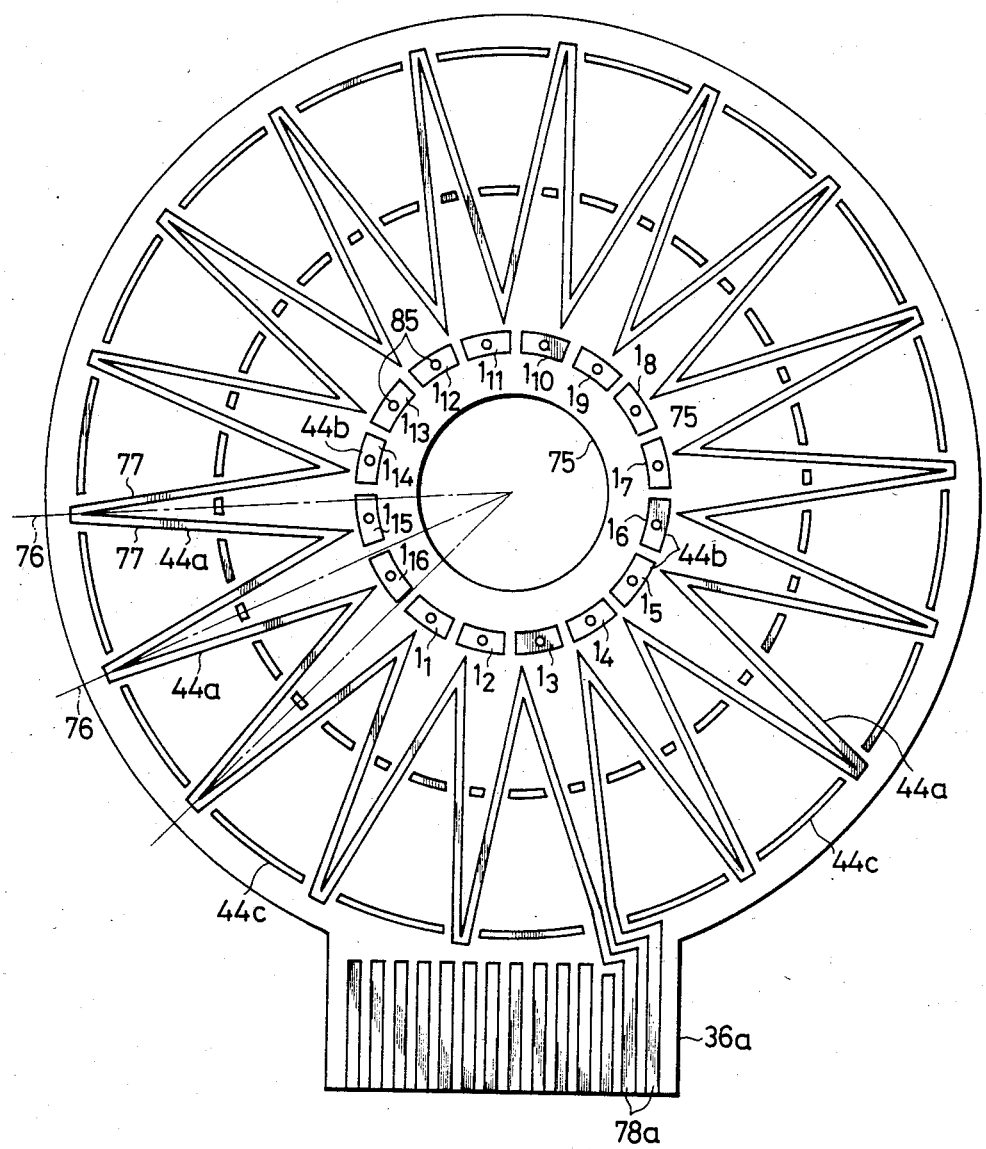
FIG. 12 is a diagram illustrating an example of patterns of wires 44 on the flexible printed circuit sheet.

FIG. 12 illustrates an example of the pattern of the wire 44 when it is formed as the FG coil. An FG coil 44a is formed in a star-shaped pattern, inter-sheet connecting conductor layers or lands 44b are arranged in a ring-shaped pattern about the circular hole 75 of the flexible printed circuit sheet 36, and reinforcing patterns 44c are formed concentrically with the conductor layers 44b. The star-shaped FG coil 44a comprises a plurality of pairs of straight FG coil segments 77, and the FG coil segments 77 of each pair are formed to extend obliquely at the same angle to and on opposite sides of one of equally-spaced lines 76 passing through the center of the circular hole 75 radially thereof. The FG coil segments 77 of each pair, which are of the same length, are connected at one end to each other and connected at the other ends to the FG coil segments 77 similarly disposed with respect to the adjoining radial lines. Thus all the FG coil segments 77 are connected in series, and the series connection is cut off at one place and connected to a pair of terminals 78 formed on the terminal portions 36a. The number N of triangular portions or edges of the star-shaped FG coil 44a is selected to be an integer which is larger than one-half of the number P of magnetic poles of the rotor magnets 19 and indivisible by P/2. With such an arrangement, an AC signal having $F=N \cdot P/B$ waves is induced in the FG coil 44a for each revolution of the rotor magnet 19, where B is a remainder integer resulting from the division of 2N by P and $0 < B \leq P/2$. In a case where N=5 and P=8, B becomes two, resulting in $F=5 \times 8/2=20$.

The FG coil need not always be limited specifically to the above-described star-shaped configuration but may also be of a form such as shown in FIG. 2 in which many coil segments are disposed radially at equiangular intervals and the inner and the outer ends of adjacent segments are alternately connected so that all the coil segments are connected in series.

Figure 13:
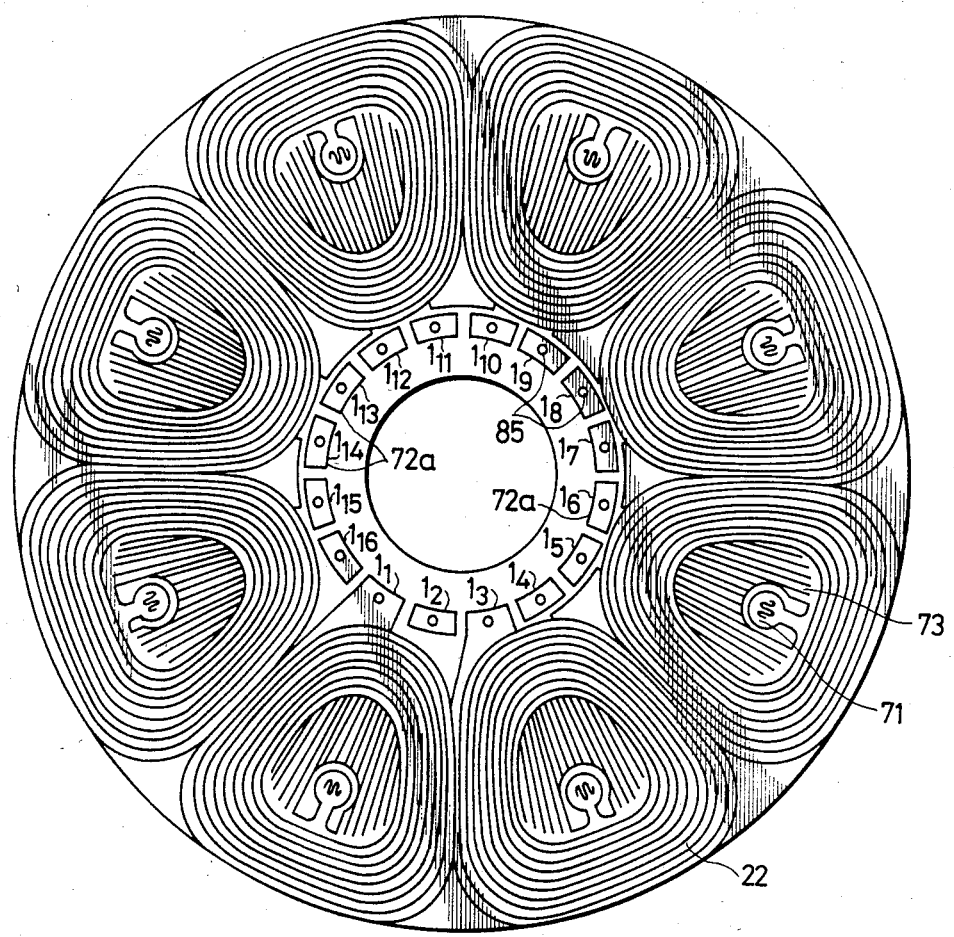
FIG. 13 is a diagram illustrating an example of patterns on one side of a sheet coil.
Figure 14:
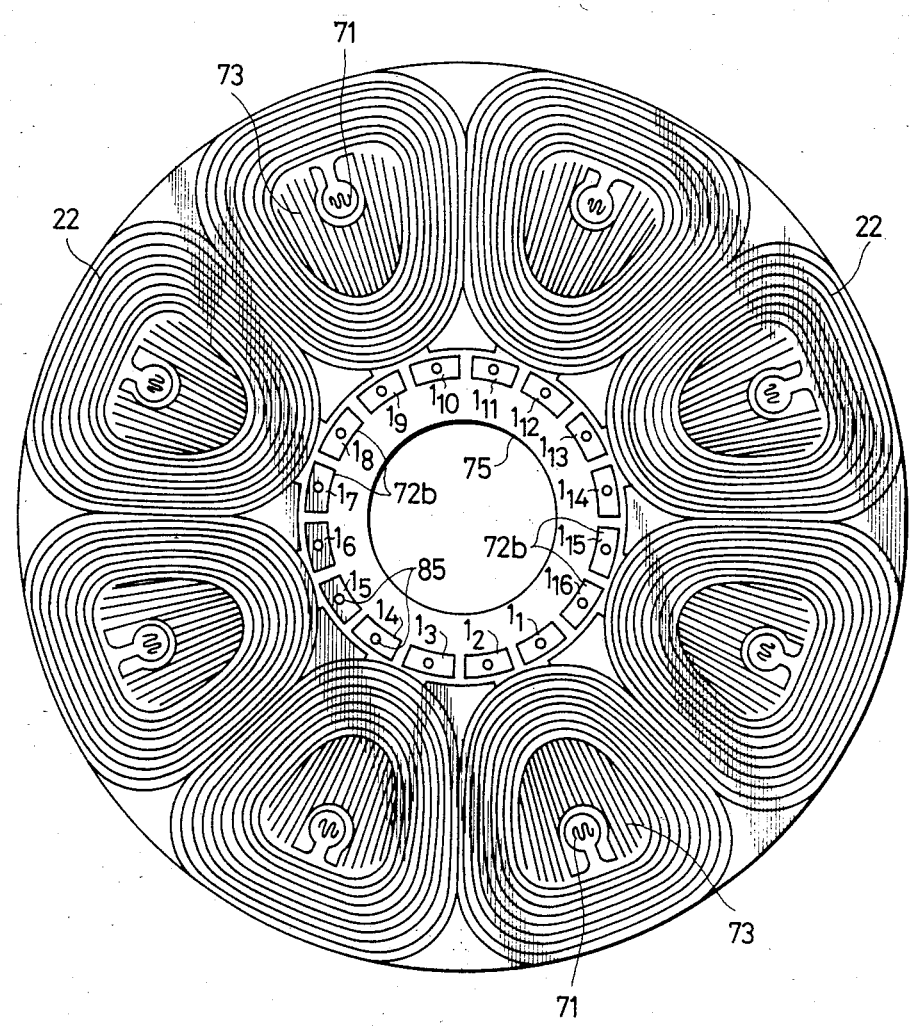
FIG. 14 is a diagram illustrating an example of patterns on the other side of the sheet coil.
Figure 15:
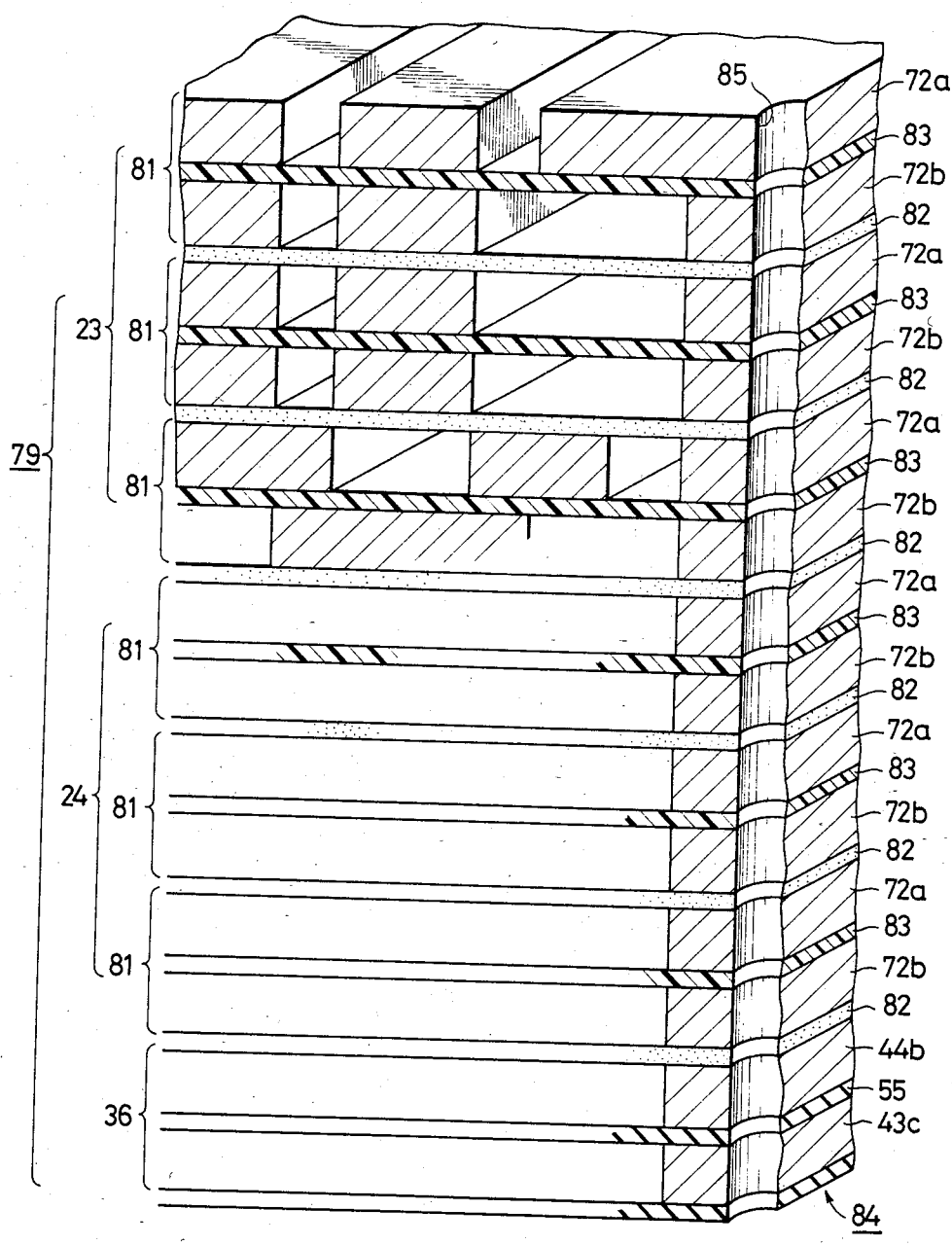
FIGS. 15 to 18 are sectional views illustrating steps involved in the connection by each interconnect section.
Figure 16:
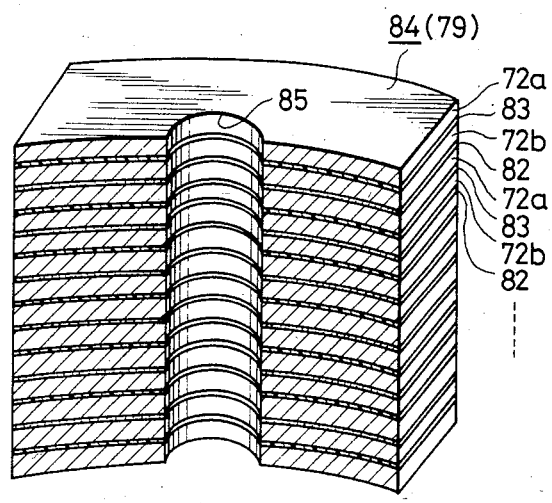

The sheet coils of the driving coil block 21 are constructed such that the spiral coils 22 shown in FIGS. 13 and 14 are formed as 10 to 200μ thick conductor patterns on one and the other sides of an insulating sheet of, for example, 30μ or less thick. In this case, the coils thus formed on one side of the insulating sheet are respectively connected, through connecting portions 71 provided centrally of the coils, to those of the opposing coils on the other side of the sheet. The coils on either side of the insulating sheet are each connected through the outermost segment to one of the adjoining coils. These connections on both sides of the insulating sheet are displaced from each other by an angular distance corresponding to one coil. Thus all of the coils 22 on both sides of the insulating sheet are interconnected in series. With such an arrangement, when supplying current to the coils 22, each pair of opposing coils generate magnetic fluxes in the same direction, but magnetic fluxes emanating from adjacent coils are opposite in direction. The flexible printed circuit sheet 36 and the sheet coil, such as described above, can be fabricated, for example, by the manufacturing method disclosed in EPC Publication No. 30008 (June 10, 1981) and the corresponding U.S. Pat. No. 4,340,833. In FIGS. 13 and 14, interconnect conductor layers 72a and 72b for interconnecting sheets and for connection to terminals are arranged in a ring-like form inside the circular arrangement of the coils. On the top surface of the sheet shown in FIG. 13, for example, the conductor layers $1_1$ and $1_3$ are respectively connected to two adjacent coils to form both terminals of the series-connected coils of the sheet coil. Formed inside each coil 22 is a reinforcement pattern 73. For instance, three such sheet coils, each having the coils 22 formed on the both sides thereof, are laminated with an insulating layer interposed between adjacent ones of them, constituting the first-phase coil 23 or the second-phase coil 24 shown in FIG. 2. Further, such a printed circuit sheet, for example, as shown in FIG. 11 is joined to the laminated sheet coils into a unitary structure. The conductor layers or lands 43c in FIG. 11 are arranged at the positions corresponding to the interconnect conductor layers 72a in FIG. 13. It is preferable that a printed circuit sheet having, on one side, the wiring patterns shown in FIG. 11 and, on the other side, the FG coil patterns shown in FIG. 12, be produced by the same method as that for the sheet coil and be laminated together with the sheet coils. For the connection of the coils of the respective sheets, or for the connection between the sheet coils and the terminals of the terminals section 36a, the aforementioned conductor layers are utilized which are formed at the central portion of each sheet. The interconnect conductor layers or lands 43c, 44b, 72a and 72b are disposed at the same angular position with respect to the rotary shaft. As illustrated in FIG. 15, three sheet coils 81, each being shown in FIGS. 13 and 14, are laminated on the flexible printed circuit sheet 36 to form the second-phase coil 24, and another triad of sheet coils 81 forming the first-phase coil 23 is laminated on the second-phase coil 24, providing a laminated structure 79. In a case of laminating sheet coils having exposed conductor surfaces, an insulating layer 82 having adhesive binder coated over the both sides of an insulating sheet of, for example, 19μ or so thick, such as a polyester sheet, is interposed between adjacent sheet coils. In a case of using such sheet coils that have conductor surfaces coated with insulator layers as of polyimide resin, the sheet coils may only be joined to adjacent ones of them with an adhesive binder. Accordingly, in this case, the insulating layer 82 has a resin-binder-resin structure. The sheet coils 81 each have conductor patterns formed on both sides of an insulating sheet 83. The interconnect conductor layers 43c, 44b, 72a and 72b lie one upon another through the insulating layers 55 and 82 or the insulating sheets 83, forming interconnect sections 84.

Figure 17:
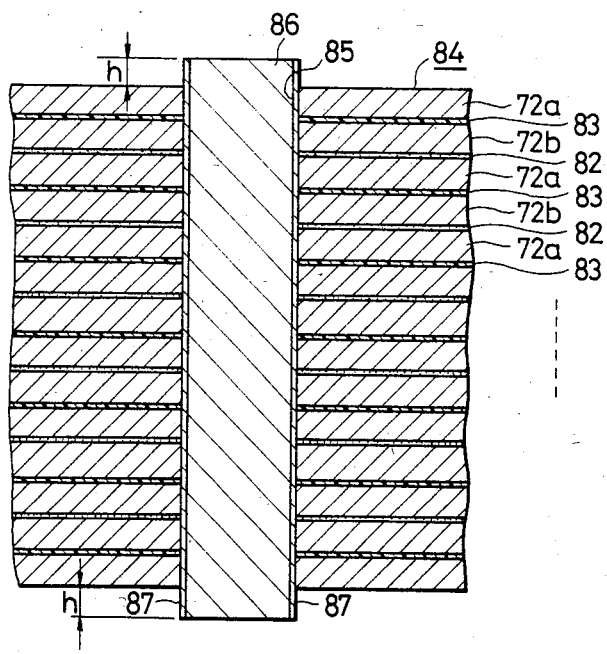

A through hole 85 is made, for instance, by means of a drill, in each interconnect section 84 of the laminated structure 79 to extend through the laminated portions 72a, 72b, 43c and 44b of the respective interconnect conductor layers as shown in FIGS. 11 to 16. A connecting conductor pin 86 is pressed into the through hole 85 as depicted in FIG. 17. The through hole 85 is, for example, a round one having a diameter of 0.1 to 2.0 mm, for instance, 0.4 mm. The connecting conductor pin 86 has a cross-section of the same size and shape as those of the cross-section of the through hole 85; in this example, the connecting conductor pin 86 is 0.4 mm in diameter and plated over the entire area of its outer peripheral surface with solder to a thickness of 5 to 20μ as indicated by 87. The connecting conductor pin 86 has its opposing ends slightly projecting out of the laminated structure 79. The length h of each projecting end of the connecting conductor pin 86 is, for instance, approximately 80μ when the laminated structure 79 is 1.5 mm thick. Before inserting the connecting conductor pin 86 into the through hole 85, soldering flux is coated over the entire area of the inner peripheral surface of the through hole 85 as required.

Figure 18:
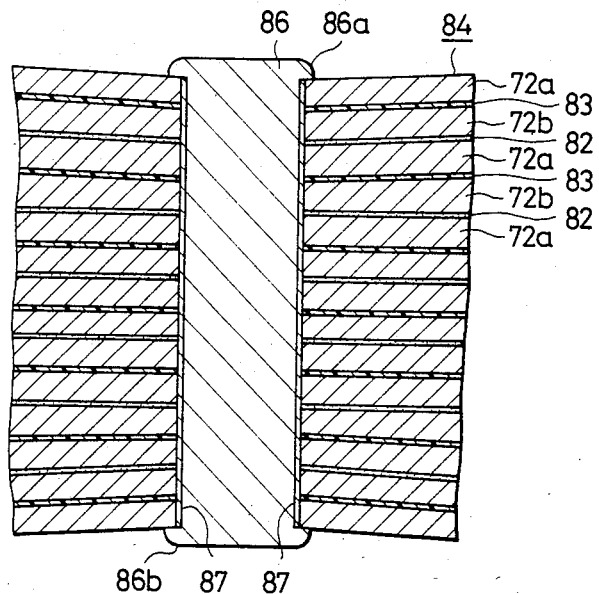

By supplying current to the connecting conductor pin 86 to heat it by Joule heat to fuse the plated solder 87, the interconnect conductor layers 43c, 44b, 72a and 72b exposed onto the inner peripheral surface of the through hole 85 are soldered with the outer peripheral surface of the connecting conductor pin 86. In this case, it is preferable to press the connecting conductor pin 86 from its opposite ends in a manner to compress it. As shown in FIG. 18, by pressing the connecting conductor pin 86, its two end portions are spread out to form flanges 86a and 86b, which firmly grip therebetween the laminated structure and, at the same time, the diameter of the connecting conductor pin 86 is slightly increased throughout its length, by the compressive force, to ensure good contact between the connecting conductor pin 86 and the conductor layers exposed onto the inner peripheral surface of the through hole 85. In this state, the conductor layers and the connecting conductor pin 86 are interconnected through the solder 87 fused by the electric heating. In our experiment, a connecting conductor pin 86 made of copper and having a 0.4 mm diameter and a 1.7 mm length was subjected to a compressive force of 4 to 5 Kg to reduce its length to 1.5 mm. A 150 Hz, 150 A current was supplied to the connecting conductor pin 86 for 0.1 second, by using a spot welding machine, and JIS 6-4 solder was used for solder plating 87, by which good contact was obtained between the connecting conductor pin 86 and the interconnect conductor layers.

By such a method as described above in connection with FIGS. 15 to 18, the interconnection of the sheet coils of the first-phase coil 23 and the interconnection of the sheet coils of the second-phase coil 24 are made through the interconnect sections 84 and, if necessary, through the wires 43d shown in FIG. 11. Further, the ends of the first- and second-phase coils 23 and 24 are connected via the interconnect sections 84 to coil terminals 88a, 88b and 89a, 89b of the terminal portion 36a in FIG. 11, respectively. From this point of view, the flexible printed circuit sheet is a wiring sheet for interconnecting the sheet coils, and it is also a terminal sheet for leading out the terminals. These two functions may also be achieved by using separate sheets, as required.

Figure 19:
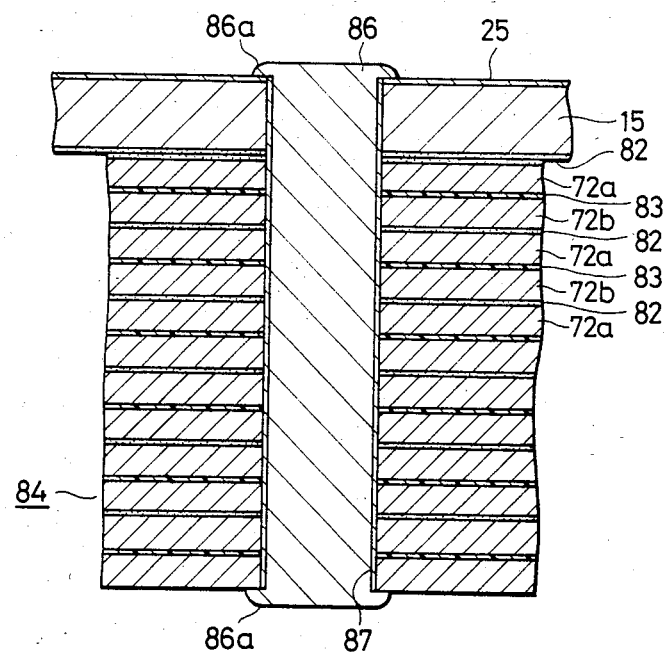
FIGS. 19 and 20 are sectional views showing other examples of the interconnect section.
Figure 20:
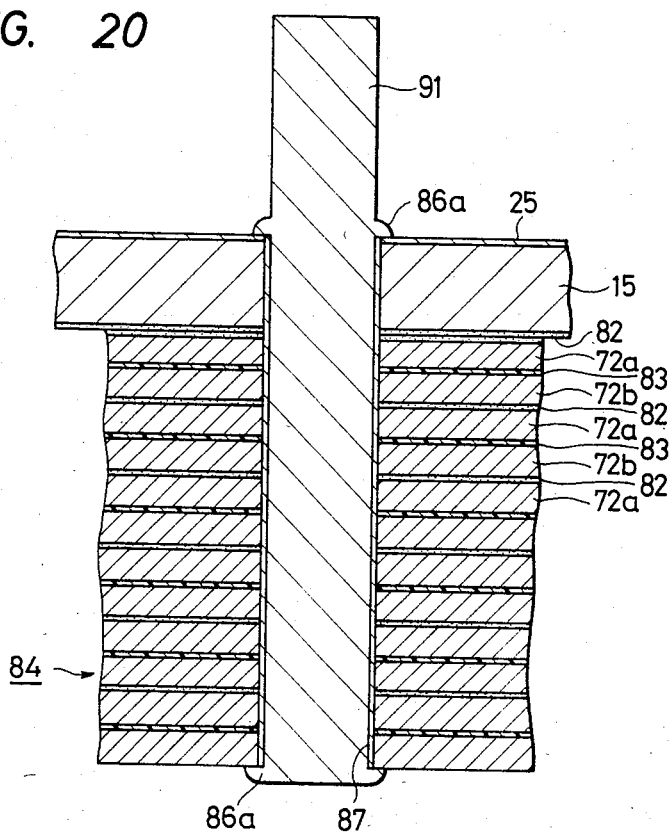

The connection method using such interconnect sections 84 is also applicable, without employing the flexible printed circuit sheet 36, to the connection between the printed circuit board 15 and the driving coil block 21 in FIGS. 1 and 2. An example is shown in FIG. 19 in which the parts corresponding to those in FIGS. 1 and 18 are identified by the same reference numerals. The printed circuit board 15 is made, for instance, of glass-fiber-reinforced epoxy resin and 500μm in thickness and, in this example, the FG coil 25 is formed as a conductor pattern. It is also possible that one end of the connecting conductor pin 86 inserted into the interconnect section 84 is extended to form a pin terminal 91, as shown in FIG. 20. The pin terminal 91 can also be used for connection when the printed circuit board 15 is not included. The connection between the sheet coils can also be made directly through the interconnect section 84.

Figure 21:
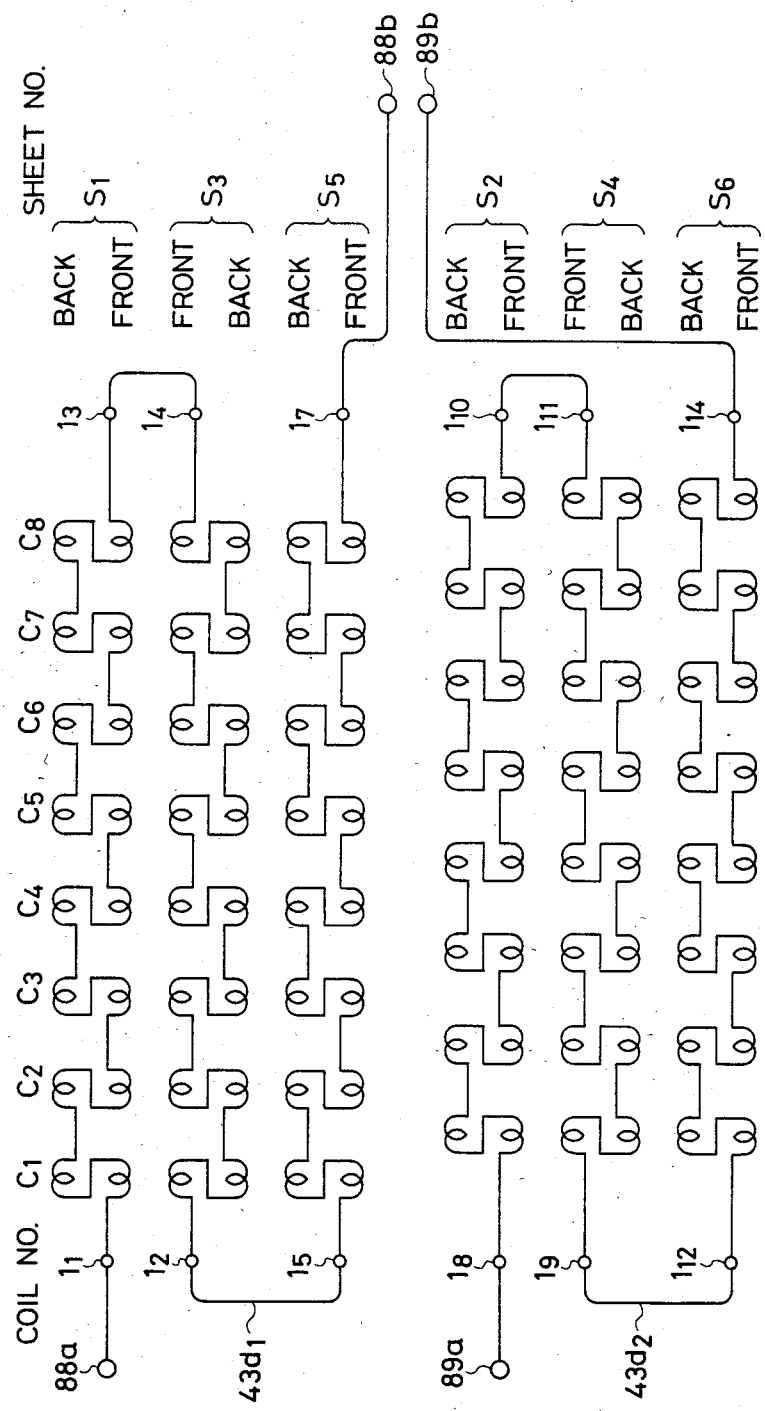
FIG. 21 is a circuit diagram illustrating an example of the interconnection of the sheet coils.

The sheet coils 81 of the first- and second-phase coils 23 and 24 need not always be provided separately of each other but may also be provided, for example, alternately with each other. An example of the connecting line pattern of the printed circuit sheet in this case is shown in FIG. 11, and the relationships of connections of the respective coils in this example are shown in FIG. 21. In FIG. 21, the sheet coils 81 are consecutively assigned sheet numbers $S_1$ to $S_6$ in the order of lamination on the flexible printed circuit sheet 36, and the side of each sheet 81 on which the pattern shown in FIG. 13 is formed is shown to be the front side of the sheet and the side of each sheet 81 having formed thereon the pattern of FIG. 14 is shown to be the back side of the sheet. The sixteen interconnect sections 84 of the interconnect conductor layers in the laminated structure of the sheets 36 and 81 are assigned numbers $1_1$ to $1_{16}$. A terminal 88a is connected to a first coil via the conductor layer $1_1$ on the front side of the sheet coil $S_1$, and an eighth coil is connected to the conductor layer $1_3$ of the sheet coil $S_1$, which is connected to the conductor layer $1_3$ of the printed circuit sheet shown in FIG. 11. The conductor layer $1_3$ of the printed circuit sheet is connected to the conductor layer $1_4$ on same, which is, in turn, connected to the eighth coil $C_8$ through the conductor layer $1_4$ on the front side of the sheet coil $S_3$. The other coils are similarly connected to make interconnection of the sheet coils.

Figure 22:
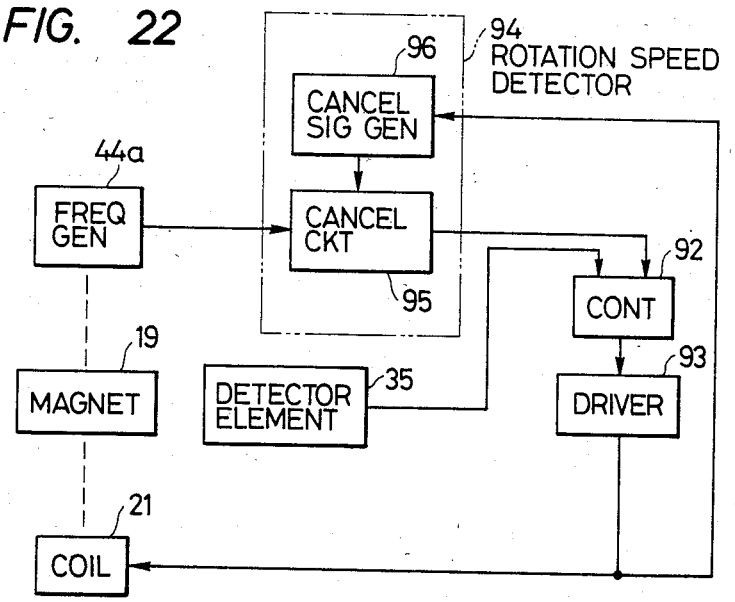
FIG. 22 is a block diagram illustrating a portion of a circuit used for speed control of the motor of the present invention.

This kind of coreless-brushless motor can be controlled in speed, for instance, through the use of such a circuit arrangement as shown in FIG. 22. The rotational angular position (the phase) of the rotor magnet 19 is detected by the detecting element 35, such as a Hall element, and the detected output is provided to a control circuit 92. The control circuit 92 applies a control signal to a drive circuit 93 for the driving coil block 21 so that a drive current may be supplied thereto in such a phase as to continue further rotation of the rotary magnet 19. On the other hand, the output of the FG coil 44a is provided to a revolving speed detector 94, and its detected output is also applied to the control circuit 92. The control circuit 92 controls the magnitude of the drive current to the driving coil block 21 so that the revolving speed of the rotor magnet 19 may be a preset value.

In the present invention, the output of the FG coil 44a is supplied to a canceller 95, and a cancel signal is derived by a cancel signal generator 96 from a current signal obtained by branching the drive current to the driving coil block 21. The cancel signal is applied to the canceller 95, by which is cancelled and removed an AC component contained in the output of the FG coil 44a on the basis of magnetic fluxes emanating from the driving coil block 21. The cancel signal generator 96 includes, for instance, a transformer and is constituted so that the drive current to the driving coil block 21 is branched to the primary side of the transformer and the output of its secondary side is level adjusted by a level adjuster and applied to the canceller 95. The canceller 95 is, for example, an analog subtractor.

The Hall element pellet 35 may also be replaced by another magnetoelectrical transducer pellet which responds to a magnetic field or flux to detect an electric signal, such as a magnetoresistive element pellet. The sheet coil 81 may also be one that has the coils formed only on one side of an insulating sheet.

As has been described in the foregoing, according to the present invention, since the Hall element pellet 35 is disposed in the recess 34 made in the stator yoke 11, the magnetic air gap between the stator yoke 11 and the rotor magnet 19 is defined mainly by the thickness of the driving coil block alone, and the magnetic air gap can be made smaller than in the structure shown in FIG. 1. By using a magnetic material, for example, soft ferrite, for the substrate 37 of the Hall element pellet 35, the recess 34 can be made magnetically equivalent to the flat stator yoke 11 in which the Hall element pellet 35 is disposed.

The present invention is more effective or advantageous as the motor becomes smaller and as the driving coil block 21 becomes thinner. For example, in a case where the driving coil block 21 is 1 mm thick, the aforesaid magnetic air gap is 3.5 mm or more in conventional motors but, according to the present invention, it can be reduced down to less than 1.5 mm; the difference is more than two-fold.

The effect of the present invention will be appreciated from the following comparison specifically made between it and the prior art in terms of motor characteristics. In a case of a six-pole two-phase motor in which the rotor magnet 19 was formed by a strontium ferrite disc 29 mm in outer diameter, 12 mm in inner diameter and 3 mm in thickness, the driving coil block 21 was a disc 34 mm in outer diameter, 8 mm in inner diameter and 1.3 mm in thickness, its number of turns was 216/phase, the rotor magnet 19 and the driving coil block 21 were spaced 0.4 mm apart and 10 Vpp was applied to the coil, the magnetic air gap between the rotor magnet and the stator yoke in the prior art motor was 4.2 mm, the magnetic flux density in the magnetic air gap was 1000 gausses and the starting torque was 57 gcm, whereas, in the motor of the present invention, the magnetic air gap was 1.8 mm, the magnetic flux density therein was 1850 gausses and the starting torque was 104 gcm. Thus it will be seen that the present invention exhibits significantly improved characteristics.

In the present invention, when the wires for the Hall element pellet 35 and the wire for leading out the coils are formed as the same patterns of the wires 43, the connection between the motor and the drive circuit can be simplified by connecting the driving coil block to the coil lead-out wires.

Further, according to the present invention, the conductor layers are arranged inside the circular arrangement of the coils on each sheet for the interconnection of the sheet coils and for the connection between each sheet coil and the terminals. The through holes 85 are each bored through the laminated structure of the interconnect conductor layers, each separated by an insulating sheet or insulating layer from immediately overlying and underlying conductor layers, and the connecting conductor pin 86 is pressed into each through hole 85. The connecting conductor pin 86 and the interconnect conductor layers are connected by solder, thus interconnecting the conductor layers through the connecting conductor pins 86. Accordingly, the motor can be made small without the necessity of leading out the terminals for interconnecting the sheet coils. Incidentally, it is considered possible to pour molten solder into the through hole 85 for interconnecting the interconnect conductor layers but, in this case, the conductor layers 72a and 72b, the insulating layers 82 and the insulating sheets 83 around the through hole 85 must be all heated to a temperature high enough to melt the solder. By this high temperature rise, some parts of the heated insulating layers 82 and the insulating sheet 83 may be carbonized to give off gas, which may be intermingled with the molten solder layer to degrade the electric connections, and the carbonized portions of the insulating layers 82 and the insulating sheets 83 may also degrade the electric connections. Moreover, if the insulating layers 82 and the insulating sheets 83 are deteriorated deep inside, then there is the possibility that the insulation between the conductor patterns which must be insulated from each other is degraded. In the present invention, however, heat is generated from the inside of the connecting conductor pin 86 and the connecting conductor pin 86 is pressed in the through hole 85, so that when the solder 87 plated on the connecting conductor pin 86 is molten, the interconnect conductor layers 72a and 72b are immediately joined together. This is free from the fear of generating gas, and ensures good connection of the connecting conductor pin 86 and conductor layers 72a and 72b. Further, this does not degrade the insulating layers 82 and insulating sheets 83 nor does it degrade the insulation between the interconnect conductor patterns. Especially, when the connecting conductor pin 86 is compressed to become a little thicker as mentioned previously, its outer peripheral surface makes close contact with the exposed inner peripheral surfaces of the holes of the conductor layers 72a and 72b to leave therebetween no room into which the molten insulating layers 82 and insulating sheets 83 flow. This ensures more excellent connection between the connecting conductor pin 86 and the conductor layers 72a and 72b. In addition, since the connecting conductor pin 86 is connected, over the entire circumference, to the conductor layers 72a and 72b, they are held in good contact with each other, and the connections are highly reliable. Besides, the work for connecting them includes only the steps of forming the through hole 85, pressing the connecting conductor pin 86 into the hole 85 and applying current to the connecting conductor pin 86, and hence is very simple and efficient. Twelve products embodying the present invention were subjected to a pressure-cooker test at 125° C., under 2 atm. for 30 hours. No abnormalities were observed and good connections were proved.

Moreover, according to the brushless motor of the present invention, the FG coil is disposed in the motor body, that is, between the rotor magnet 19 and the stator yoke 11. Therefore, the motor of the present invention can be made smaller in size and lower in cost than in the case of providing a permanent magnet and a detecting coil separately of the motor body. Further, by selecting the number of the segments of the FG coil, an AC signal of a relatively high frequency can be obtained, by which the revolving speed of the motor, even if revolving at a low speed, can be detected with high accuracy. In addition, since the influence of the magnetic flux caused by the driving coil block 21, every wave of the AC component by the rotor magnet 19 can be detected with certainty, permitting accurate detection of the revolving speed of the motor. Accordingly, the revolving speed of the motor can be detected with a high degree of accuracy.

It will be apparent that many modifications and variations may be effected without departing from the scope of the novel concepts of the present invention.

What is claimed is:

1. A coreless-brushless motor comprising:
   a stator yoke;
   a driving coil block fixed to said stator yoke, said driving coil block comprising a plurality of sheet coils each having a plurality of spiral coils of a conductor pattern arranged on a circle at equiangular intervals on at least one side of an insulating sheet, said plurality of sheet coils being sequentially laminated together with an insulating layer interposed between each adjacent pair of said sheet coils;
   bearing means fixed to said stator yoke;
   a rotary shaft rotatably supported by said bearing means;
   a rotor yoke affixed to said rotary shaft;
   rotor magnet means mounted on said rotor yoke in adjacent and opposing relation to said driving coil block;
   a recess formed in a surface of said stator yoke adjacent said driving coil block, the depth of said recess inwards of said surface being less than the thickness of said stator yoke;
   a flexible printed circuit sheet comprising a flexible insulating sheet having a plurality of connecting wires of a conductor pattern formed on said flexible insulating sheet, said flexible printed circuit sheet being interposed between said driving coil block and said stator yoke;
   a magnetoelectric transducer pellet for detecting the magnetic field of said rotor magnet means, said pellet having a substrate and a magnetoelectric transducer formed thereon, said pellet being located in said recess with said magnetoelectric transducer being disposed on that side of said recess which is adjacent to said driving coil block, the depth of said recess being substantially equal to the thickness of said magnetoelectric transducer pellet; and
   a hole, larger in size than said transducer pellet, formed in and extending through said flexible printed circuit sheet in confronting relation to the said recess in the surface of said stator yoke, electrodes of said magnetoelectric transducer being connected via said hole to at least two of said connecting wires in said flexible printed circuit sheet.

2. A coreless-brushless motor according to claim 1, wherein a shallow depression contiguous to the recess is formed in the stator yoke to surround the recess, and wherein the flexible printed circuit sheet is extended onto the bottom of the shallow depression, wires on the extended portion of the flexible printed circuit sheet and the electrodes of the magnetoelectric transducer pellet being interconnected by means of wire bonding.

3. A coreless-brushless motor according to claim 1, 2, or 3, wherein said magnetoelectric transducer pellet is buried in a molding of a resinous material.

4. A coreless-brushless motor according to any one of claims 1, or 2, wherein the magnetoelectric transducer pellet is a Hall element pellet.

5. A coreless-brushless motor according to any one of claims 2 or 4, wherein the flexible printed circuit sheet has formed thereon a frequency generating coil responsive to magnetic fluxes from the rotor magnet to induce an AC signal of a frequency proportional to the revolving speed of the rotor magnet.

6. A coreless-brushless motor according to claim 1 wherein the driving coil block has interconnect sections, each of said interconnect sections comprising interconnect conductor lands formed on insulating sheets and laminated in opposing relation to one another with insulating material interposed therebetween, a through hole extending through the interconnect conductor lands, the insulating sheets and the insulating layers, and an interconnect conductor pin pressed into said through hole and having its outer peripheral surface electrically connected to those portions of the interconnect conductor layers which are exposed at the inner peripheral surface of the through hole.

7. A coreless-brushless motor according to claim 6 wherein a frequency generating coil is disposed between the stator yoke and the rotor magnet means, the frequency generating coil being formed by a plurality of pairs of straight frequency generating coil segments, the frequency generating coil segments of each pair being disposed obiquely at the same angle to one of radial lines arranged at eqiangular intervals about the rotary shaft and connected at their outer ends to each other on said one radial line and connected at their inner ends respectively to those of the frequency generating coil segments of the adjoining pairs so that all the frequency generating coil segments are sequentially connected in series, the outer ends of one of said pairs being left unconnected and extended as terminals.

8. A coreless-brushless motor according to claim 1 wherein at least two connecting terminals formed integrally with said connecting wires project into said hole from a peripheral edge thereof, said connecting terminals being connected directly to said electrodes of said transducer pellet.

9. A coreless-brushless motor comprising:
a stator yoke;
a driving coil block fixed to said stator yoke and comprising a plurality of sheet coils each having a plurality of spiral coils of a conductor pattern arranged on a circle at equiangular intervals on at least one side of an insulating sheet, said plurality of sheet coils being sequentially laminated together with an insulating layer interposed between each adjacent pair of said sheet coils;
bearing means fixed to said stator yoke;
a rotary shaft rotatably supported by said bearing means;
a rotor yoke affixed to said rotary shaft;
rotor magnet means mounted on said rotor yoke in adjacent and opposing relation to said driving coil block;
each of said sheet coils comprising at least two interconnect conductor lands formed at predetermined positions on the side of the insulating sheet on which the spiral coils are formed, corresponding ones of said interconnect conductor lands of each adjacent pair of said sheet coils overlying one upon another via the said insulating layer interposed therebetween to form a plurality of interconnect sections each composed of a group of said overlying interconnect conductor lands, one winding end of each of said sheet coils being extended to merge into one of said interconnect conductor lands on said insulating sheet, said one of the interconnect conductor lands belonging to one of said interconnect sections; and
connecting conductor pins each of which has a solder layer covering a circumferential surface thereof and each of which is press-inserted into a respective through hole which extends through the laminated said sheet coils at each of said interconnect sections so that the outer peripheral surface of each of said connecting couductor pins is electrically connected to said interconnect conductor lands via said solder layer at the inner peripheral surface of a corresponding one of said through holes.

10. A coreless-brushless motor according to claim 9 wherein one winding end of one of the other sheet coils is extended to merge into one of the interconnect conductor lands on the same insulating sheet, said one of the interconnect conductor lands belonging to one of the interconnect sections, thereby interconnecting the winding ends of said one of the sheet coils and said one of the other sheet coils through the corresponding one of said connecting conductor pins inserted in said one of the interconnect sections.

11. A coreless-brushless motor according to claim 9 wherein said driving coil block comprises a printed circuit sheet laminated together with said sheet coils; said printed circuit sheet comprising a plurality of interconnect conductor lands formed on one side of an insulating sheet at the positions corresponding to the respective interconnect sections and connected thereto by said connecting conductor pins, respectively, and a wiring conductor pattern formed on said insulating sheet; one winding end of one of the other sheet coils being extended to merge into one of the interconnect conductor lands which belongs to both one of the other interconnect sections and said one of the other sheet coils; and the wiring conductor pattern including a connecting wire connecting both the interconnect conductor lands of said printed circuit sheet belonging to said one of the interconnect sections and said one of the other interconnect sections, respectively, thereby electrically connecting said one winding end of said one of the sheet coils to said one winding end of said one of the other sheet coils.

12. A coreless-brushless motor according to claim 9, wherein said driving coil block comprises a terminal sheet laminated together with said sheet coils; said terminal sheet comprising a plurality of interconnect conductor lands formed on an insulating sheet at the positions corresponding to the respective interconnect sections and connected thereto by said connecting conductor pins, respectively, and a conductor pattern of terminals and a connecting wire one of the terminals to one of the interconnect conductor lands of said terminal sheet which belongs to said one of the interconnect sections, thereby electrically leading out said one winding end of said one of the sheet coils as one winding end of said driving coil block through said connecting conductor pin to said one of the terminals.

13. A coreless-brushless motor according to claim 11, wherein said printed circuit sheet comprises a terminal section radially extending out from the outer circumference of said drive coil block and having formed thereon a plurality of terminals connected to said interconnect conductor layers of said printed circuit sheet.

14. A coreless-brushless motor according to claim 9, wherein a printed circuit board is laminated together with said sheet coils of the driving coil block; and said printed circuit board comprises: a plurality of interconnect conductor lands formed thereon at the positions corresponding to the respective interconnect sections and connected thereto by said connecting conductor pins extended into through holes located in said printed circuit board in alignment with the through holes of said interconhect sections; a terminal section radially extending out from the outer circumference of said driving coil block; and a plurality of terminals formed on said terminal section and connected to the interconnect conductor lands of said printed circuit board.

15. A coreless-brushless motor according to claim 14, wherein the printed circuit board has formed thereon a frequency generating coil responsive to magnetic fluxes from the rotor magnet to induce an AC signal.

16. A coreless-brushless motor according to any one of claims 11, 12, 13, 14, 9, wherein each connection conductor pin has at its both end portions flanges formed integrally with the peripheral surface thereof.

17. A coreless-brushless motor according to any one of claims 10, 11, 12, 13 or 9, wherein one end of at least one of said connecting conductor pins is extended from the laminated structure to form a pin terminal.

18. A coreless-brushless motor according to claim 9, wherein a frequency generating coil is disposed between the stator yoke and the rotor magnet means, the frequency generating coil being formed by a plurality of pairs of straight frequency generating coil segments, the frequency generating coil segments of each pair being disposed obliquely at the same angle to and symmetrically on both sides of one of radial lines arranged at equiangular intervals about the rotary shaft and connected at their outer ends to each other on said one radial line and connected at their inner ends respectively to those of the frequency generating coil segments of the adjoining pairs so that all the frequency generating coil segments are sequentially connected in series, the outer ends of one of said pairs being left unconnected and extended as terminals.

19. A coreless-brushless motor according to one of claims 11, 12, 13 or 6, wherein the interconnect conductor lands on each insulating sheet are arranged inside the circular arrangement of the spiral coils.

20. A coreless-brushless motor according to claim 11, wherein the other side of said insulating sheet has formed thereon a frequency generating coil responsive to magnetic fluxes from the rotor magnet means to induce an AC signal of a frequency proportional to the revolving speed of the rotor magnet means.

21. A coreless-brushless motor according to claim 20, wherein the interconnect conductor lands on each insulating sheet are arranged inside the circular arrangement of the spiral coils.

22. A coreless-brushless motor according to claim 21, wherein the printed circuit sheet has a terminal section extending outwardly of the circular arrangement of the spiral coils of the laminated sheet coils, terminals of the interconnected sheet coils and terminals of the frequency generating coil being led out through the wiring pattern onto the terminal section.

23. A coreless-brushless motor comprising:
a stator yoke;
a driving coil block fixed to said stator yoke and comprising a plurality of sheet coils each having a plurality of spiral coils of a conductor pattern arranged on a circle at equiangular intervals on at least one side of an insulating sheet, said plurality of sheet coils being sequentially laminated together with an insulating layer interposed between each adjacent pair of said sheet coils;
bearing means fixed to said stator yoke;
a rotary shaft rotatably supported by said bearing means;
a rotor yoke affixed to said rotary shaft;
rotor magnet means mounted on said rotor yoke in adjacent and opposing relation to said driving coil block;
a frequency generating coil disposed between said rotor magnet means and said stator yoke for producing a composite AC signal which includes a revolving speed signal component resulting from magnetic fluxes produced by said rotor magnet means and which also includes a drive current signal component resulting from magnetic fluxes from said driving coil block, said revolving speed signal component having a frequency proportional to the revolving speed of said rotor magnet means; and
motor drive circuit means comprising a driver connected to said driving coil block for supplying thereto a drive current whose magnitude is responsive to a control signal, canceller means connected both to the output of said frequency generating coil and to the output of said driver for receiving said composite AC signal and for also receiving a current signal corresponding to said drive current, said canceller means being operative to use said current signal to cancel said drive current signal component of said composite AC signal thereby to derive said revolving speed signal component of said composite AC signal, and a control circuit connected to the output of said canceller means for producing said control signal in response to said revolving speed signal component.

24. A coreless-brushless motor according to claim 23 wherein the frequency generating coil comprises a plurality of pairs of straight frequency generating coil segments; the frequency generating coil segments of each pair being disposed obliquely at the same angle to and symmetrically on both sides of one of radial lines arranged at equiangular intervals about the rotary shaft and connected at their outer ends to each other on said one radial line and connected at their inner ends respectively to those of the frequency generating coil segments of the adjoining pairs so that all the frequency generating coil segments are sequentially connected in series; the outer ends of one of said pairs being left unconnected and extended as terminals.

25. A coreless-brushless motor comprising:
a stator yoke;
a driving coil block fixed to said stator yoke and comprising a plurality of sheet coils each having a plurality of spiral coils of a conductor pattern arranged on a circle at equiangular intervals on at least one side of an insulating sheet, said plurality of sheet coils being sequentially laminated together with an insulating layer interposed between each adjacent pair of said sheet coils;
bearing means fixed to said stator yoke;
a rotary shaft rotatably supported by said bearing means;
a rotor yoke affixed to said rotary shaft;
rotor magnet means mounted on said rotor yoke in adjacent and opposing relation to said driving coil block; and
a frequency generating coil disposed between the rotor magnet means and the stator yoke, the frequency generating coil being formed by a plurality of pairs of straight frequency generating coil segments, the frequency generating coil segments of each pair being disposed obliquely at the same angle to and symmetrically on both sides of one of radial lines arranged at equiangular intervals about the rotary shaft and connected at their outer ends to each other on said said one radial line and connected at their inner ends respectively to those of the frequency generating coil segments of the adjoining pairs so that all the frequency generating coil segments are sequentially connected in series, the outer ends of one of said pairs being left unconnected and extended as terminals.

* * * * *